(12) United States Patent
Sirbuly et al.

(10) Patent No.: US 11,500,128 B2
(45) Date of Patent: Nov. 15, 2022

(54) BROADBAND ABSORBERS VIA NANOSTRUCTURES

(71) Applicant: The Regents of the University of California, Oakland, CA (US)

(72) Inventors: Donald J. Sirbuly, Carlsbad, CA (US); Zhaowei Liu, San Diego, CA (US); Conor Riley, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 397 days.

(21) Appl. No.: 16/479,892

(22) PCT Filed: Jan. 23, 2018

(86) PCT No.: PCT/US2018/014919
§ 371 (c)(1),
(2) Date: Jul. 22, 2019

(87) PCT Pub. No.: WO2018/136972
PCT Pub. Date: Jul. 26, 2018

(65) Prior Publication Data
US 2019/0339418 A1 Nov. 7, 2019

Related U.S. Application Data

(60) Provisional application No. 62/449,507, filed on Jan. 23, 2017.

(51) Int. Cl.
*G02B 1/00* (2006.01)
*C23C 16/02* (2006.01)
(Continued)

(52) U.S. Cl.
CPC ............. *G02B 1/002* (2013.01); *C23C 16/02* (2013.01); *C23C 16/45525* (2013.01);
(Continued)

(58) Field of Classification Search
CPC .. G02B 1/002; G02B 5/003; G02B 2207/101; G02F 2202/30
See application file for complete search history.

(56) References Cited

U.S. PATENT DOCUMENTS 8,669,833 B2 3/2014 Ueda
9,255,328 B2 2/2016 Purkl et al.
(Continued)

OTHER PUBLICATIONS

Butt et al. "Metamaterial filter for the near-visible spectrum" Applied Physics Letters, 2012, vol. 101, No. 8, 4 pages.
(Continued)

*Primary Examiner* — Robert E. Tallman
(74) *Attorney, Agent, or Firm* — Perkins Coie LLP

(57) ABSTRACT

The document discloses transferrable hyperbolic metamaterial particles (THMMP) that display broadband, selective, omnidirectional absorption and can be transferred to secondary substrates, allowing enhanced flexibility and selective transmission. A device having metamaterial nanostructures includes a substrate and metamaterial nanostructures engaged to the substrate to form an optical layer to interact with light incident to the optical layer to exhibit optical reflection or absorption or transmission that is substantially uniform over a spectral range of different optical wavelengths associated with materials and structural features of the metamaterial nanostructures, each metamaterial nanostructure including different material layers that are interleaved to form a multi-layer nanostructure.

16 Claims, 27 Drawing Sheets

(51) Int. Cl.
　　　*C23C 16/455*　　　(2006.01)
　　　*C23C 16/56*　　　(2006.01)
　　　*G02B 5/00*　　　(2006.01)
　　　*G03F 7/00*　　　(2006.01)

(52) U.S. Cl.
　　　CPC .............. *C23C 16/56* (2013.01); *G02B 5/003* (2013.01); *G03F 7/0015* (2013.01); *G02B 2207/101* (2013.01)

(56) References Cited

U.S. PATENT DOCUMENTS

| | | |
|---|---|---|
| 2010/0277789 A1 | 11/2010 | Wu et al. |
| 2013/0160936 A1* | 6/2013 | Cheah ..................... B32B 3/16 427/160 |
| 2014/0209160 A1* | 7/2014 | Schroeder ............ H01L 31/073 438/69 |
| 2014/0292615 A1 | 10/2014 | Liu et al. |
| 2015/0160936 A1 | 6/2015 | Morgan |
| 2015/0288318 A1 | 10/2015 | Guler et al. |

OTHER PUBLICATIONS

ISA, International Search Report and Written Opinion for International Application No. PCT/US2018/014919. dated May 16, 2018. 13 pages.

* cited by examiner

BROADBAND ABSORBERS VIA NANOSTRUCTURES

PRIORITY CLAIM AND CROSS REFERENCE TO RELATED APPLICATIONS

This patent document is a 371 National Phase Application of PCT Application No. PCT/US2018/014919, filed on Jan. 23, 2018 which claims the benefit of priority of U.S. Provisional Patent Application No. 62/449,507, filed on Jan. 23, 2017. The entire contents of the before-mentioned patent applications is incorporated by reference as part of the disclosure of this document.

TECHNICAL FIELD

This patent document relates to systems, devices, and processes related to materials based on nanoparticles or nanostructures.

BACKGROUND

Various natural or man-made materials exhibit material properties based on their material compositions. With advancement in material engineering, various artificially engineered structures based on combinations of different materials and structures have been or are being developed as "metamaterials" that exhibit new and useful material properties or behaviors. Notably, various metamaterials may be designed to exhibit unique properties, which are not attainable with naturally occurring materials and arise from their specially designed "meta-atom" structure rather than their chemical compositions. For example, some metamaterials have been shown to have a negative permittivity $\varepsilon$, a negative permeability $\mu$, or a negative refractive index n (i.e., negative $\varepsilon$ and $\mu$ simultaneously) at the desired electromagnetic wave spectral ranges.

SUMMARY

The present document discloses material structures formed by nanostructures to exhibit plasmonic responses that can be engineered for various applications. For example, the disclosed material structures can be designed to absorb light over a broadband spectral range, including some spectral ranges that are used to achieve desired optical properties such as infrared or far-infrared ranges, to have a nearly constant optical absorption over wide incident angles or over different optical polarizations. The disclosed material structures can be fabricated by first forming their constitutional nanostructures over a substrate and the formed nanostructures or layers of such nanostructures can be transferred onto other substrates and/or self-assembled onto substrates.

In one example aspect, a device having metamaterial nanostructures may include a substrate; and metamaterial nanostructures engaged to the substrate to form an optical layer to interact with light incident to the optical layer to exhibit optical absorption or transmission that is substantially uniform over a spectral range of different optical wavelengths associated with materials and structural features of the metamaterial nanostructures, each metamaterial nanostructure including different material layers that are interleaved to form a multi-layer nanostructure.

In another example aspect, a device having metamaterial nanostructures, comprising a substrate that is flexible; and an array of metamaterial nanopillars engaged to the substrate to form an optical layer, each metamaterial nanopillar including alternating semiconductor and dielectric layers to exhibit a plasmonic response to incident light to exhibit optical absorption or transmission that is substantially uniform over a spectral range of different optical wavelengths associated with materials and structural features of the metamaterial nanopillars.

In another example aspect, a method for making a device having metamaterial nanostructures, comprising forming metamaterial nanostructures on a first substrate by depositing and patterning the deposited materials on the first substrate to form distinctive structures on the first substrate as the metamaterial nanostructures, wherein materials and structural features of the metamaterial nanostructures are designed to exhibit optical absorption or transmission that is substantially uniform over a spectral range of different optical wavelengths, separating the metamaterial nanostructures from the first substrate, and transferring the metamaterial nanostructures onto a second substrate that is different from the first substrate.

In another example aspect, a layered metamaterial structure comprising a first layer comprising a dielectric material and a second layer comprising a plasmonic material is disclosed. The plasmonic material has a carrier concentration that exhibits plasmons in a target operating frequency band. The structure comprises one or more spherical nanoparticles in which a number of concentric first and second layers alternate with each other. The structure comprises one or more cylindrical nanotubes comprising coaxial layering of the first layer and the second layer along a longitudinal axis. The structure further comprises an air core at the longitudinal axis.

In another example aspect, a structure with multilayered metamaterials may include alternating layers of dielectric and plasmonic materials, and a secondary substrate to which the alternating layers of the dielectric and plasmonic materials formed on a primary substrate is transferred. The plasmonic material has a carrier concentration that exhibits plasmons in a target operating frequency band. The alternating layers of dielectric and plasmonic materials have a sphere shape in which a number of concentric dielectric and plasmonic layers alternate with each other. The alternating layers of dielectric and plasmonic materials have a cylinder shape in which a number of coaxial dielectric and plasmonic layers alternate with each other.

In another example aspect, a method of fabricating an array of nanoparticle structures. The method includes generating a silicon hole array template using nanosphere lithography, filling in holes of the silicon hole array using atomic layer deposition by multilayered structures of hyperbolic metamaterials (HMMs), etching, using a reactive ion etching or wet etching process, a top layer of result of the filling operation, thereby exposing underlying silicon of the silicon hole array, and removing silicon surrounding hyperbolic metamaterial to leave behind an array of packed multilayered structures of HMMs.

In applications, various structures based on the disclosed technology can be used to absorb light with optically thin materials for many applications such as camouflage, light detection and energy harvesting and may be transferred to more desirable substrates for mechanically flexible and low-cost applications. The disclosed material structures can be arranged as arrays or close-packed configurations to show broadband, selective, omnidirectional, optical absorption.

The above aspects, their implementations and applications are described in detail in the drawings, the description and the claims.

DETAILED DESCRIPTION

Figure 1:
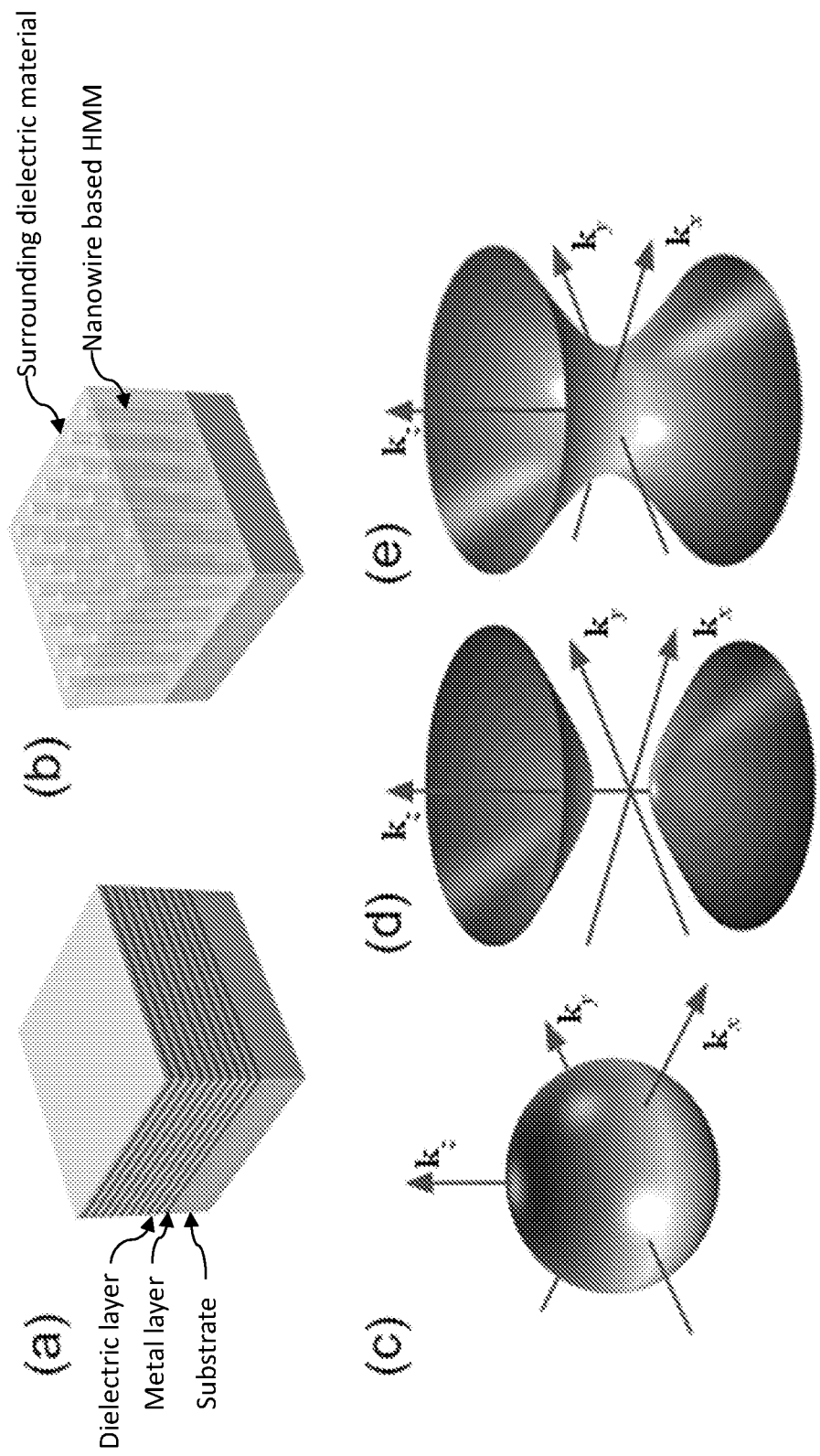
FIG. 1 illustrates schematic geometries of (a) multilayer and (b) nanowire based hyperbolic metamaterials (HMMs), (c) spherical isofrequency surface for an isotropic dielectric, and hyperboloid isofrequency surface for a uniaxial medium with (d) one negative components and (e) two negative components of the dielectric tensor.

Coating a structure with a material that has different optical, radiative or absorptive characteristics can make the structure look to be something different when viewed, scanned or sensed from distance. Such altering of properties of the structure, or the substrate, can have many useful industrial applications in areas such as telecommunications, and military applications such as camouflaging. In the past, scientists have attempted to design the applicative material. However, for the reasons discussed herein, such material has found limited use in practical application due to several reasons.

One such material that has been studied by researchers is carbon nanotubes. Carbon nanotubes show high, broadband and omnidirectional absorption. However, films made from carbon nanotubes are relatively thick. In addition, it is impossible to select the spectral region in which absorption occurs. Hyperbolic metamaterial (HMM) pyramids show broadband absorption. However, they have only been proven by low melting point noble metals, and omnidirectional absorption has not been experimentally determined and is only expected for transverse magnetic (TM) polarizations. Further, many designs use metallic substrates. Perfect metamaterial absorbers coupled to material losses have also been shown. These materials also rely on planar back reflectors and dielectric spacers. This is problematic because planar metallic materials cannot be flexed, are generally not optically transparent, and such materials possess a wide surface area, which makes thermal lattice mismatch an issue for high temperature applications.

The field of plasmonics has grown at an aggressive pace over the past two decades, fueled mainly by a host of exciting applications which includes new optical interconnects, cancer therapeutics, biosensors, spectroscopy, hyperbolic dispersion, light emission, and guidance of light in subwavelength features. Most plasmonic materials consist of noble metals such as gold or silver due to their strong resonances in the visible part of the electromagnetic spectrum, but this poses an immediate problem for complementary metal-oxide-semiconductor (CMOS) technologies since pure metal components are not well-suited for CMOS processing and they are expensive. Furthermore, the plasmonic responses are fixed in the visible which makes plasmonic responses in the infrared (IR) limited. Active plasmonic materials in the IR (particularly around 1550 nm) could play a significant role in areas such as energy filtering, broadband absorption, telecommunication optical modulations, and IR light generation. Therefore, alternative materials such as highly-doped semiconductors have been gaining significant traction due to their tunable plasmonic properties in the IR. However, it is still difficult to consistently synthesize plasmonic materials that have low-loss in the IR region and even more challenging to fabricate materials that can be easily transferred to secondary substrates or mechanically flexible surfaces without sacrificing performance. It is therefore timely to make a strong push towards improving the optical response of highly-doped semiconductors and utilizing their properties to engineer novel plasmonic materials for high-performance devices.

The disclosed technology in this patent document apply nanoengineering techniques to develop a new class of transferrable hyper-crystals (THC), constructed of an array of hyperbolic metamaterial (HMM) units that exhibit strong optical anisotropy and can be easily transferred to secondary substrates while maintaining their optical performance. Incorporating HMMs into the unit cell of a material provides a new degree of freedom in designing materials with unique properties, while the transferable characteristics remarkably enhance their practicality. In implementing the disclosed technology, various geometries or shapes of hyperbolic metamaterial (HMM) units may be used, such as nanotubes, nanocylinders, nanospheres and others. The experimental realization of the proposed THC relies on developing low-loss, IR tunable plasmonic semiconductors that can be conformally deposited on nanoscale features using techniques such as atomic layer deposition (ALD). As a concept-proof-experiment, the THC will be used to demonstrate selective, omnidirectional broadband absorbers.

When light interacts with a highly polarizable material (i.e., contains free electrons) the electrons collectively oscillate in response to the electromagnetic wave which creates a plasmon. When the plasmon is confined to a surface such as in the case of a nanoparticle it is termed a localized surface plasmon resonance (LSPR). These LSPRs have been at the core of many of the plasmonic applications since they are highly tunable, dependent on the chemical composition of the material, surrounding medium, shape, and size, and can significantly amplify the local fields near the surface. One of the most important parameters for LSPRs is the oscillator strength, f, which is proportional to the number of free electrons in the material. The oscillator strength of plasmonic materials can reach ~100, compared to ~1 for fluorescent nanomaterials such as a quantum dot, which explains why there are such strong light-matter interactions with plasmonic materials (scattering cross-section is proportional to $f^2$).

One of the other key fundamentals in plasmonic physics, other than the oscillator strength, is the modal volume, $V_m$, which is the effective volume that the LSPR takes up. This is important since it is inter-related to the oscillator strength and losses of the plasmonic resonances. In general, $V_m$ is on the order of 10 nm$^3$ for nanomaterial resonances in the visible part of the spectrum, but if the size of the material is larger than the skin depth (i.e., penetration depth of the EM wave before decaying to 1/e of its original value) than the LSPRs can become extremely lossy for traditional noble metals such as gold and silver. These metals are the preferred plasmonic materials in the visible regime due to their small ohmic losses or DC conductivity, but other losses begin to dominate at other wavelengths namely the higher-frequency interband losses (e.g., promotion of valence electrons to the Fermi surface) and lower-frequency intraband (e.g., free electron losses) or Drude losses. A closer look at the metal's free-electron response to light describes these losses in terms of the dielectric permittivity, ε, and magnetic permeability, μ. Since the magnetic interaction is weak for optical frequencies, μ is close to one and permittivity remains the main parameter to understand the light-matter interactions.

The material permittivity is a complex quantity, requiring both a real (ε') and imaginary (ε") part to properly describe the dielectric function. The real part is related to the polarization response of the metal and the imaginary part is related to the losses (i.e., interband, intraband, and additional scattering losses). Metals operating at resonant frequencies have a negative real permittivity and a non-zero imaginary permittivity. The Drude model helps describe the behavior of plasmonic materials by treating the electrons as a free-electron gas or plasma. The dielectric constant of a plasma is given as $\varepsilon(\omega)=1-\omega_p^2/\omega^2$ where $\omega_p$ is the bulk plasma frequency defined as $$\omega_p = \sqrt{\frac{ne^2}{\varepsilon_0 m_e}}.$$

In the $\omega_p$ expression n is the majority carrier concentration, e is the elemental charge, $\varepsilon_0$ is the free space permittivity, and $m_e$ is the effective mass of the electron. Using a damping coefficient (γ) and a background permittivity ($\varepsilon_\infty$), to take into account electron collisions and the dielectric response of bound atomic charges, respectively, a complex permittivity expression can be written such that:

$$\varepsilon(\omega) = \varepsilon' + i\varepsilon'' = \varepsilon_b - \frac{\omega_p^2}{(\omega^2+\gamma^2)} + i\frac{\omega_p^2 \gamma}{(\omega^2+\gamma^2)\omega} \quad \text{Eq. (1)}$$

The damping coefficient, or relaxation rate, is directly linked to the scattering/ohmic losses and is directly proportional to the imaginary part of the dielectric function. Likewise, $\omega_p^2$ is proportional to the carrier concentration (n) and also scales directly with ε". Therefore, to decrease losses in a plasmonic material, either the relaxation rate, carrier concentration, or both, have to be reduced. Conventional noble metal plasmonics have extremely large n (~$10^{23}$ cm$^{-3}$) which causes ε" to be very large in the IR and limits their use at these frequencies. In addition, the large polarizability of the noble metals prohibits their use in external field driven applications such as electrochromics, optical modulations, and transistors. One approach to push LSPRs out into the IR and allow low loss plasmonic systems (ε"≈0) is to use materials such as heavily-doped semiconductors.

Creating semiconductors that behave like metals (ε'<0) at NIR wavelengths (e.g., λ=1.55 μm) is achieved by doping to levels >$10^{20}$ cm$^{-3}$. However, this poses major technical difficulties and serious constraints on the choice of the material. Furthermore, at high doping concentrations the mobility (μ) of the carriers decreases which causes the relaxation rate (and hence ε') to increase according to γ=e/μ$m_e$ where $m_e$ is the effective mass of the carrier. Reducing the losses requires that the product of the effective mass and mobility be as large as possible which puts upper limits on the dopant concentration. Another issue that needs to be dealt with when choosing a semiconductor is the optical band gap. If the gap is similar or smaller than the plasmon frequency this will induce further optical losses due to interband transitions. Taking all these parameters into consideration leaves several prime semiconductor candidates for plasmonic materials including silicon, germanium, III-V compound semiconductors (e.g., GaAs, InP, GaN), and transparent metal oxides (e.g., zinc oxide [ZnO], indium tin oxide). Of these materials, aluminum-doped zinc oxide (AZO) has become a leader for plasmonic applications given its large optical band gap and ability to achieve high doping levels with lower loss than any other material reported. Therefore, AZO will be the main material platform investigated in the proposal to fabricate the NIR broadband absorbing materials and devices, but other materials such as nitrides (e.g., TiN) will also be explored because of their pronounced responses in the visible.

FIG. 1 illustrates schematic geometries of (a) multilayer and (b) nanowire based HMMs, (c) spherical isofrequency surface for an isotropic dielectric, and hyperboloid isofrequency surface for a uniaxial medium with (d) one negative components and (e) two negative components of the dielectric tensor. The HMMs can support waves with extremely high k-vectors. HMMs are one type of anisotropic material systems that possess permittivities with opposite signs along orthogonal directions. Since metals and dielectrics have negative and positive permittivities, respectively, at optical frequencies, HMMs may be made of metal-dielectric composites. When the features are much smaller than the working wavelength, the HMMs can be described by an effective medium approximation (EMA). The effective permittivities $\varepsilon_x$, $\varepsilon_y$ and $\varepsilon_z$ in the x, y and z directions can be tuned by the metal filling factor p, and calculated by the following equations in the 1D multilayer (Eq. 2) and 2D nanowire systems (Eq. 3):

$$\begin{cases} \varepsilon_x = \varepsilon_y = p\varepsilon_m + (1-p)\varepsilon_d \\ \varepsilon_z = \left(\dfrac{p}{\varepsilon_m} + \dfrac{1-p}{\varepsilon_d}\right)^{-1} \end{cases} \quad \text{Eq. (2)}$$

$$\begin{cases} \varepsilon_z = p\varepsilon_m + (1-p)\varepsilon_d \\ \varepsilon_x = \varepsilon_y = \varepsilon_d \dfrac{(1+p)\varepsilon_m + (1-p)\varepsilon_d}{(1-p)\varepsilon_m + (1+p)\varepsilon_d} \end{cases} \quad \text{Eq. (3)}$$

The effective material properties of the metamaterial are determined by selecting appropriate metal-dielectric combinations, filling ratios and working wavelengths. HMMs get their name from the topology of the isofrequency surface. In vacuum, the linear dispersion and isotropic behavior of propagating waves implies a spherical isofrequency surface given by the equation $k_x^2 + k_y^2 + k_z^2 = \omega^2/c^2$. Here, $\omega$ is the frequency of radiation and c is the velocity of light in free space. For anisotropic metamaterials, this isofrequency relation changes to $(k_x^2 + k_y^2)/\varepsilon_z + k_z^2/\varepsilon_x = \omega^2/c^2$, where the in-plane isotropic components are $\varepsilon_x = \varepsilon_y$ and the out of plane component is $\varepsilon_z$. If $\varepsilon_x$ and $\varepsilon_z$ have different signs, the isofrequency surface of the metamaterial becomes hyperbolic, as shown in FIG. 1d ($\varepsilon_x > 0$, $\varepsilon_z < 0$) and FIG. 1e ($\varepsilon_x < 0$, $\varepsilon_z > 0$). The high transverse k-vector coverage is the underlying foundation for light control at nanoscale dimensions using HMMs. Since the HMMs are very dispersive, and highly geometry dependent, the working wavelength ranges for multilayer and nanowire systems are UV-visible and visible-IR, respectively. Therefore, appropriate structure/material systems first need to be selected based on the wavelength region required for a given application then the metamaterial can be engineered to achieve the dispersion relation of waves that provides unique electromagnetic modes. Some of the unique applications for these types of HMMs include hyperlenses, negative refraction, sub-wavelength modes, and spontaneous emission engineering.

Figure 2:
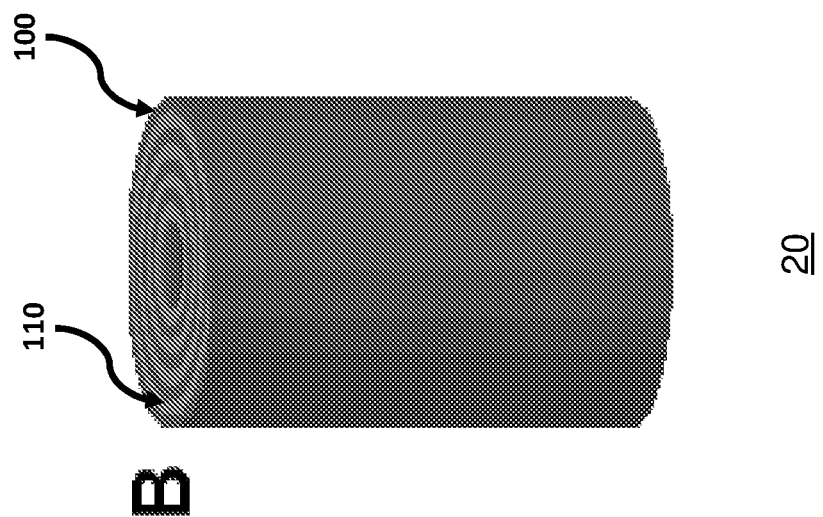
FIG. 2 illustrates two examples of hyperbolic metamaterial particles in the form of (A) hyperbolic spheres and (B) hyperbolic tubes.
Figure 2:
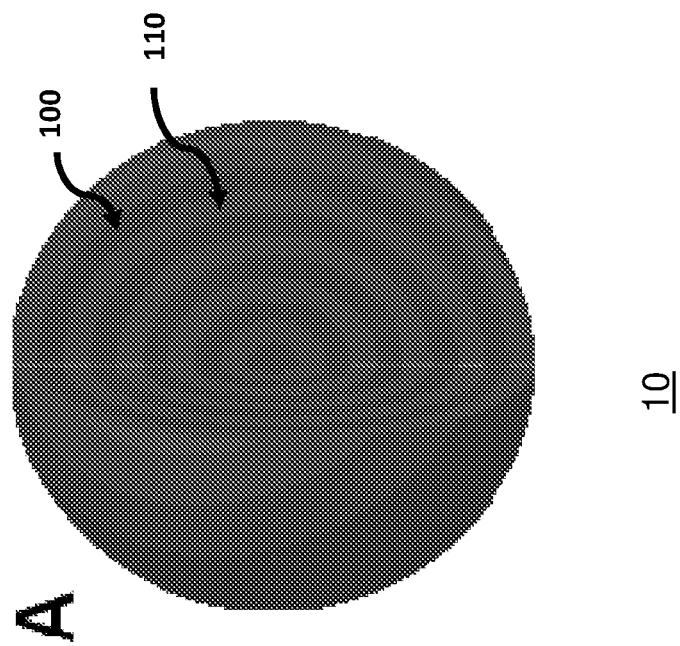

The present document discloses a hyperbolic metamaterial particles (HMP) and techniques for manufacturing the material. In some embodiments, the HMP is a material comprised of alternating layers of dielectric materials and materials that possess large enough carrier concentrations to support plasmons at the operating wavelengths (plasmonic materials). Two examples of this are the hyperbolic tubes and spheres as shown in FIG. 2. In this patent document, the plasmonic materials may be implemented by semiconductors that contain more free electrons than the pure semiconductors. For example, the plasmonic materials may include semiconductors doped with metal impurities.

FIG. 2 illustrates two examples of hyperbolic metamaterial particles in the form of (A) hyperbolic spheres and (B) hyperbolic tubes. As can be seen here, the hyperbolic metamaterial particles implemented based on the disclosed technology may be made of alternating layers 100 and 110 of dielectric and plasmonic layers. In an embodiment, examples of the plasmonic layers may include semiconductor layers doped with impurities. For example, the impurities may include metal impurities. Examples of the plasmonic layers may include Transparent Conduction Oxide (TCO) layers, Doped Oxide layers, Aluminum Zinc Oxide (AZO) layers, Indium Tin Oxide (ITO) layers, and Titanium Nitride (TiN) layers.

Figure 3:
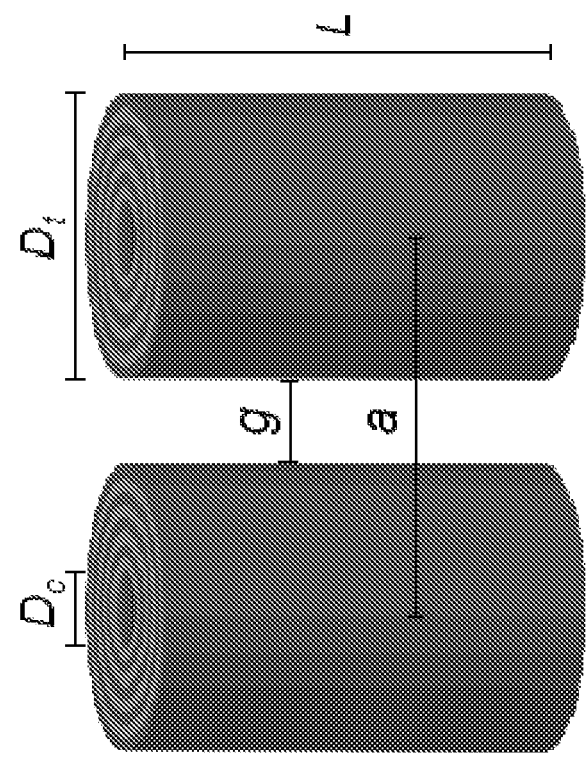
FIG. 3 is an example schematic of coupled hyperbolic nanotubes (HNTs).

FIG. 3 is an example schematic of coupled HNTs. As shown in FIG. 3, a hyperbolic nanotube can be defined in terms of its length, L, total diameter, $D_t$, and air core diameter, $D_c$. The shell is comprised of n HMM periods with alternating plasmonic (e.g., metal, semiconductor doped with impurities) and dielectric concentric layers of thicknesses $t_m$ and $t_d$, respectively. Here, one period has a thickness, p, equal to $t_m + t_d$ and the total shell thickness is given as the product of n and p. When oriented in an array, the lattice period, a, and HNT gap, g, are also defined, where $a = g + D_t$. For example, the parameters L=1.5 μm, $D_t$=740 nm, $D_c$=220 nm, g=30 nm, a=770 nm, n=13, and $t_m = t_d$=10 nm may be used. The origin of broadband absorption is theoretically examined by finite difference time domain measurements using hyperbolic nanotubes comprised of zinc oxide as the dielectric and aluminum doped zinc oxide as the plasmonic material.

In some embodiments, the length (height) L of the hyperbolic nanotube is in a range of from about 100 nm to about 50 μm, the total diameter $D_t$ of the hyperbolic nanotube is in a range of from about 200 nm to about 5 μm, the air core diameter $D_c$ is in a range of from about 50 nm to about 2 μm, the number 'n' of HMM periods is in a range of from about 2 to about 100, the thickness $t_m$ of the alternating plasmonic layer is in a range of from about 5 nm to about 200 nm, the thickness $t_d$ of the alternating dielectric layer is in a range of from about 5 nm to about 200 nm, the thickness 'p' of one period is in a range of from about 10 nm to about 400 nm, the lattice period (e.g., a distance between centers of adjacent HMMS) 'a' is in a range of from about 100 nm to about 20 μm, the HNT gap 'g' is in a range of from about 0 to about 10 μm, and the deposition temperature of the HNT arrays is in a range of from about 100° C. to about 300° C.

Figure 4:
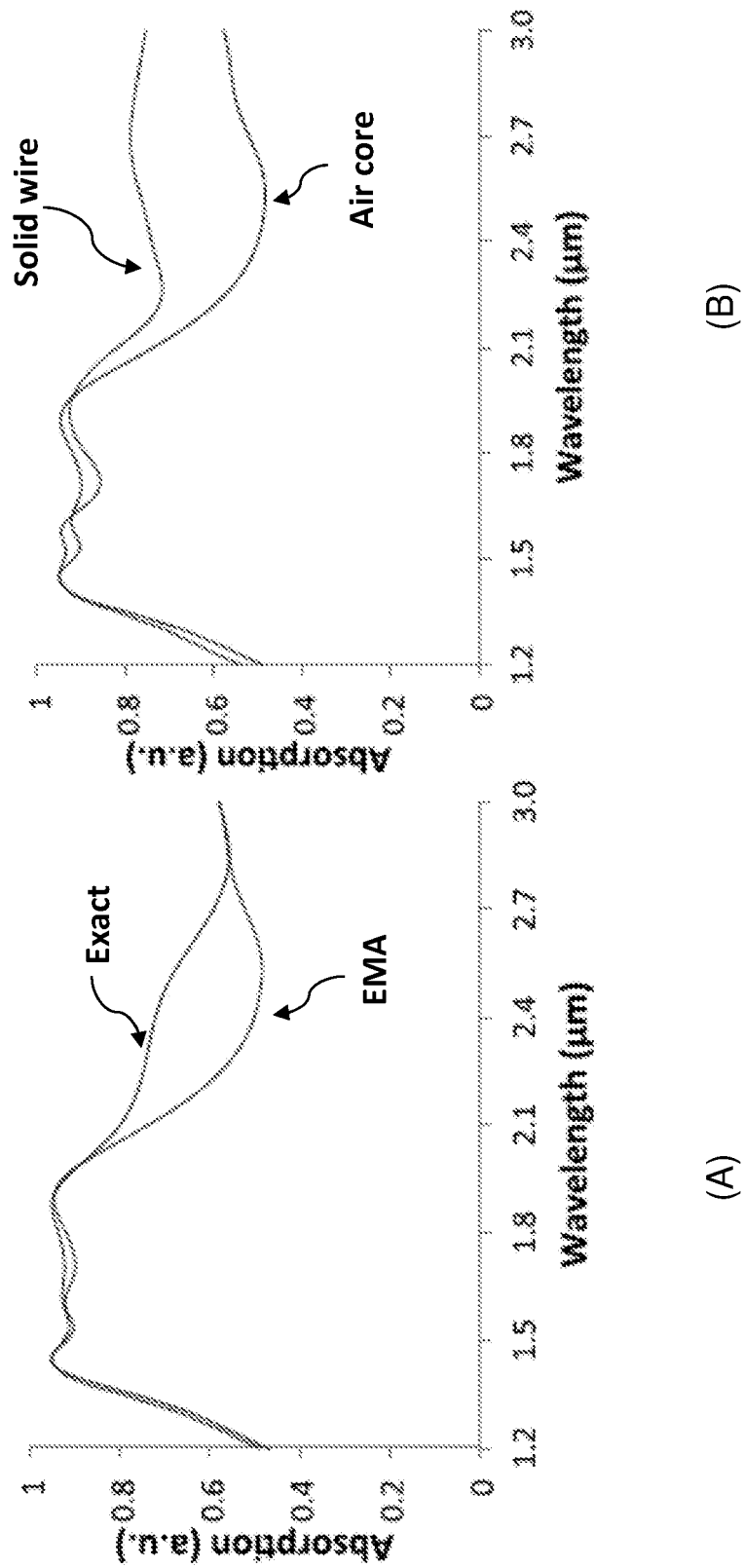
FIG. 4 shows simulated absorption of (A) the exact structure and an effective medium approximation (EMA) to describe the HNT shell and (B) EMA HNT arrays with air cores and solid hyperbolic metamaterial nanowires.

FIG. 4 shows simulated absorption of (A) the exact structure and an EMA to describe the HNT shell and (B) EMA HNT arrays with air cores and solid hyperbolic metamaterial nanowires. Using complex permittivity values, the simulated absorption of a closely packed HNT array is shown in FIG. 4A. The parameters used in the simulations are L=1.5 μm, Dt=740 nm, Dc=220 nm, g=30 nm, a=770 nm, n=13, and tm=$t_d$=10 nm. The data show absorption values greater than 90% from 1,400 to 2,000 nm. In addition to simulations that explicitly compute for a structure described by each individual ZnO and AZO layer (exact structure), simulations may be carried out where the permittivity of the shell material is replaced with the permittivity tensor derived from EMA for curved multilayer structures. This is accomplished by describing the electrical response of the system in terms of a diagonal effective permittivity tensor:

$$\varepsilon^{\mathit{eff}} = \begin{bmatrix} \varepsilon_{xx} & 0 & 0 \\ 0 & \varepsilon_{yy} & 0 \\ 0 & 0 & \varepsilon_{zz} \end{bmatrix} \quad \text{Eq. (4)}$$

where the elements $\varepsilon_{xx}$, $\varepsilon_{yy}$, and $\varepsilon_{zz}$ describe the permittivity along the three principal directions of a Cartesian (rectangular) coordinate system.

Hyperbolic dispersion arises when one of the elements is unique and of opposite sign to the remaining two that are of equal value:

$$\varepsilon_{xx}=\varepsilon_{\parallel}>0; \ \varepsilon_{yy}=\varepsilon_{zz}=\varepsilon_{\perp}<0 \quad \text{Eq. (5)}$$

or $$\varepsilon_{xx}=\varepsilon_{\parallel}<0; \ \varepsilon_{yy}=\varepsilon_{zz}=\varepsilon_{\perp}>0 \quad \text{Eq. (6)}$$

where the parallel and perpendicular directions are referenced with respect to the interfaces between constituent materials.

For a planar multilayer HMM made up of oscillating layers of metal and dielectric materials, the tensor elements can be given as:

$$\varepsilon_{\perp} = \mathit{ff}_m \varepsilon_m + (1-\mathit{ff}_m)\varepsilon_d \quad \text{Eq. (7)}$$

$$\varepsilon_{\parallel} = \left( \frac{\mathit{ff}_m}{\varepsilon_m} + \frac{1-\mathit{ff}_m}{\varepsilon_d} \right)^{-1} \quad \text{Eq. (8)}$$

where $\mathit{ff}_m$ is the filling fraction of the metallic component, and $\varepsilon_m$ and $\varepsilon_d$ are the permittivities of the metal and dielectric, respectively.

A cylindrical multilayer, with alternating layers forming concentric circles, can be accurately described using a coordinate transformation. In Cartesian coordinates, the effective permittivity tensor of the cylindrical multilayer is:

$$\varepsilon^{\mathit{eff}} = \begin{bmatrix} \varepsilon_{\parallel}\cos^2(\phi)+\varepsilon_{\perp}\sin^2(\phi) & (\varepsilon_{\parallel}-\varepsilon_{\perp})\sin(\phi)\cos(\phi) & 0 \\ (\varepsilon_{\parallel}-\varepsilon_{\perp})\sin(\phi)\cos(\phi) & \varepsilon_{\parallel}\sin^2(\phi)+\varepsilon_{\perp}\cos^2(\phi) & 0 \\ 0 & 0 & \varepsilon_{\perp} \end{bmatrix} \quad \text{Eq. (9)}$$

where the angle Φ describes rotation about the axis of symmetry.

As shown in FIG. 4(A), the exact structure agrees well with EMA. Thus, it is possible to simulate the structure with less computational expense and study the effects of adjusting Dt and Dc without changing n and p. In FIG. 4(B), the simulations also show that the existence of the core has little effect on the absorption.

Figure 5:
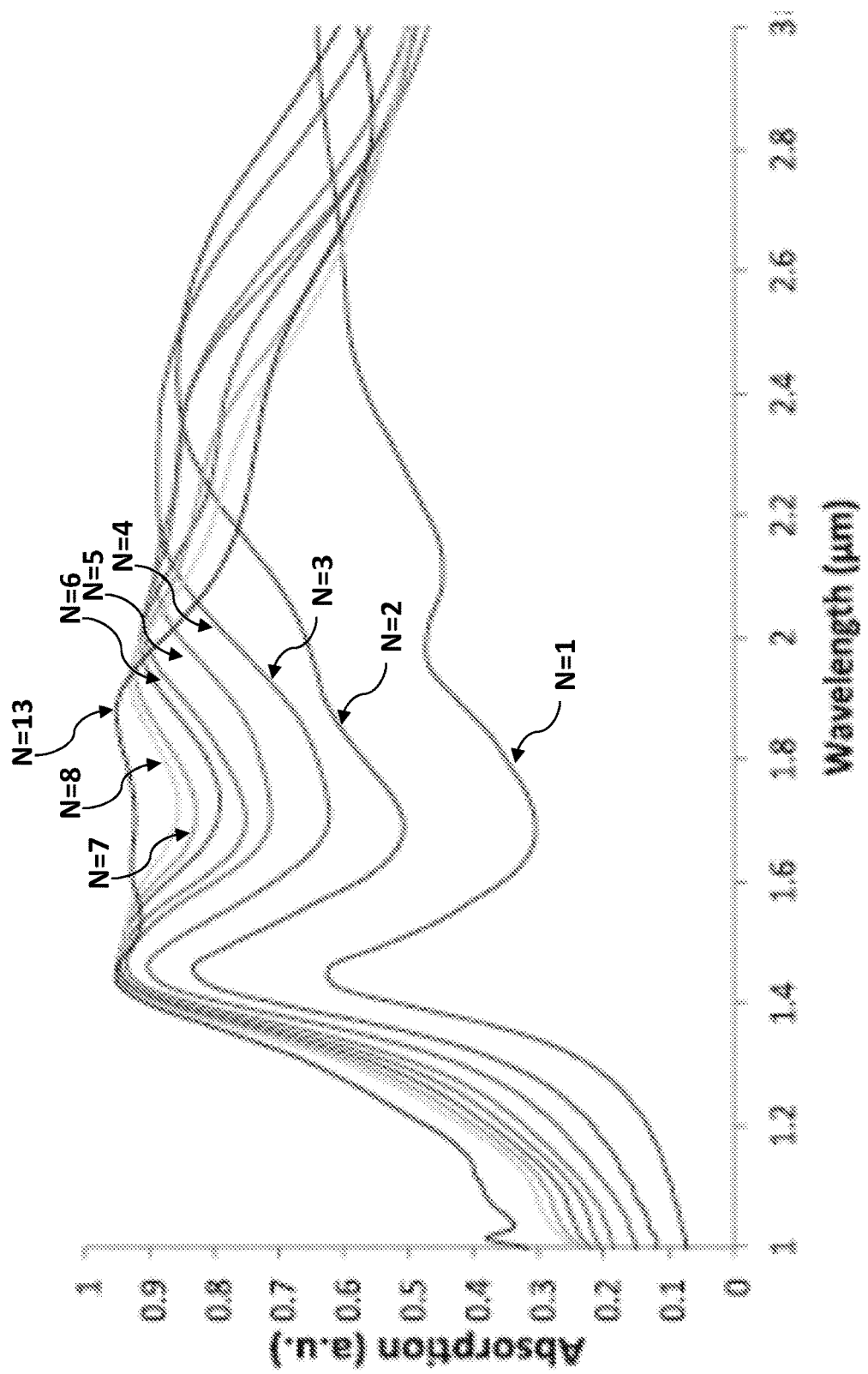
FIG. 5(A) shows examples of simulated absorption of HNTs with increasing n from 1-8 and 13 with a constant inter-pillar gap distance.
FIG. 5(B) shows simulated absorption of exact structure HNT arrays with varying a and constant Dt.
FIG. 5(C) shows simulated absorption of EMA solid hyperbolic nanowire arrays of varying diameter.
FIGS. 5(D) and 5(E) shows simulated absorption using the exact structure of HNTs with varying (D) lengths and (E) filling factor of metallic material $ff_m$ in the shell.
FIG. 5(F) shows simulated absorption using the exact structure of HMMs compared with the HNTs.
Figure 5:
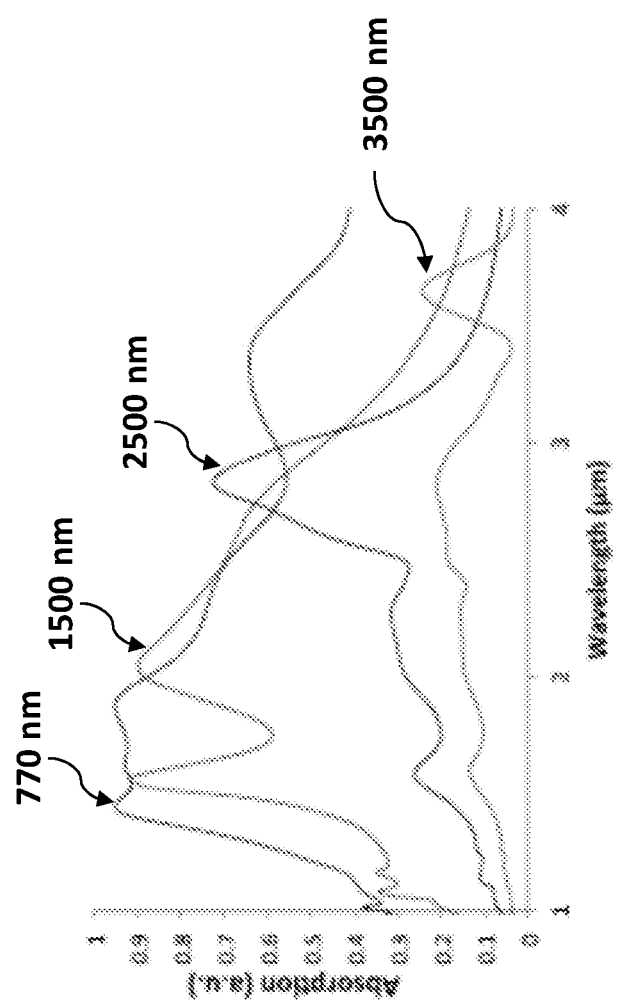
Figure 5:
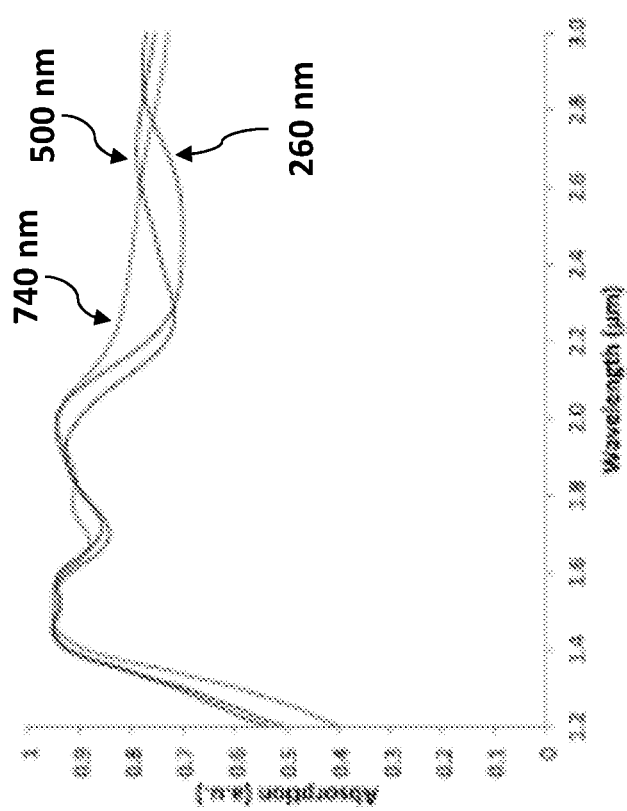
Figure 5:
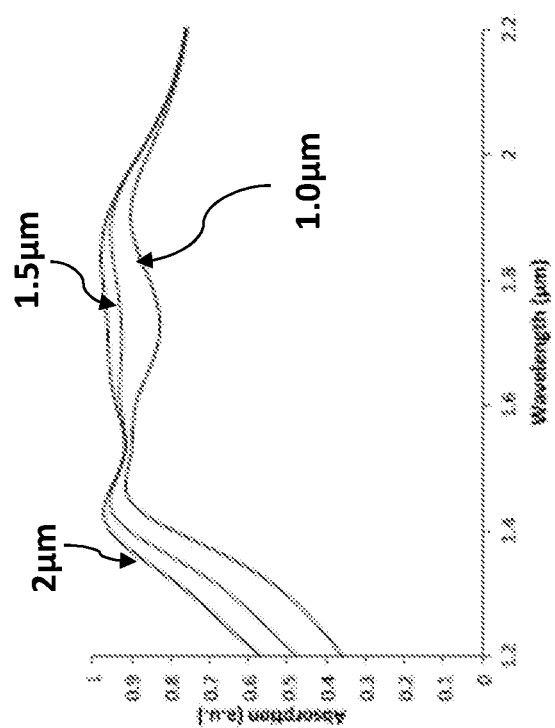
Figure 5:
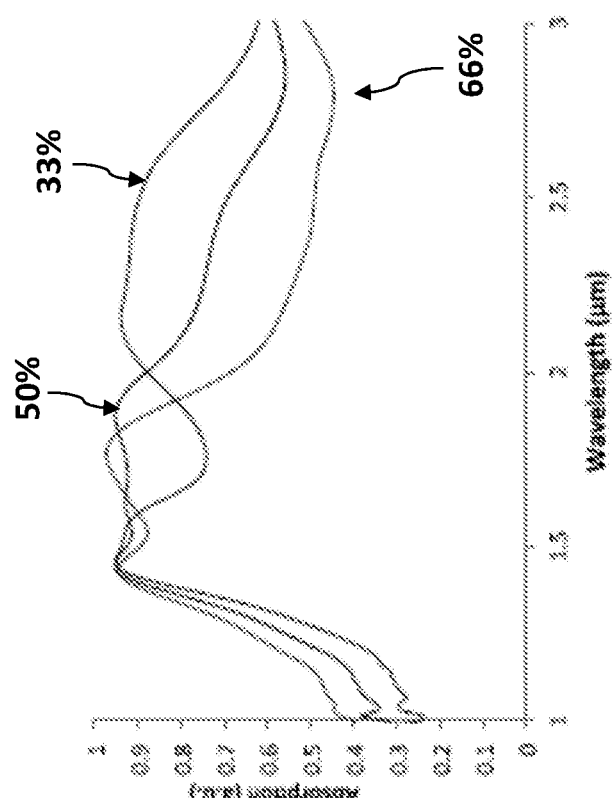
Figure 5:
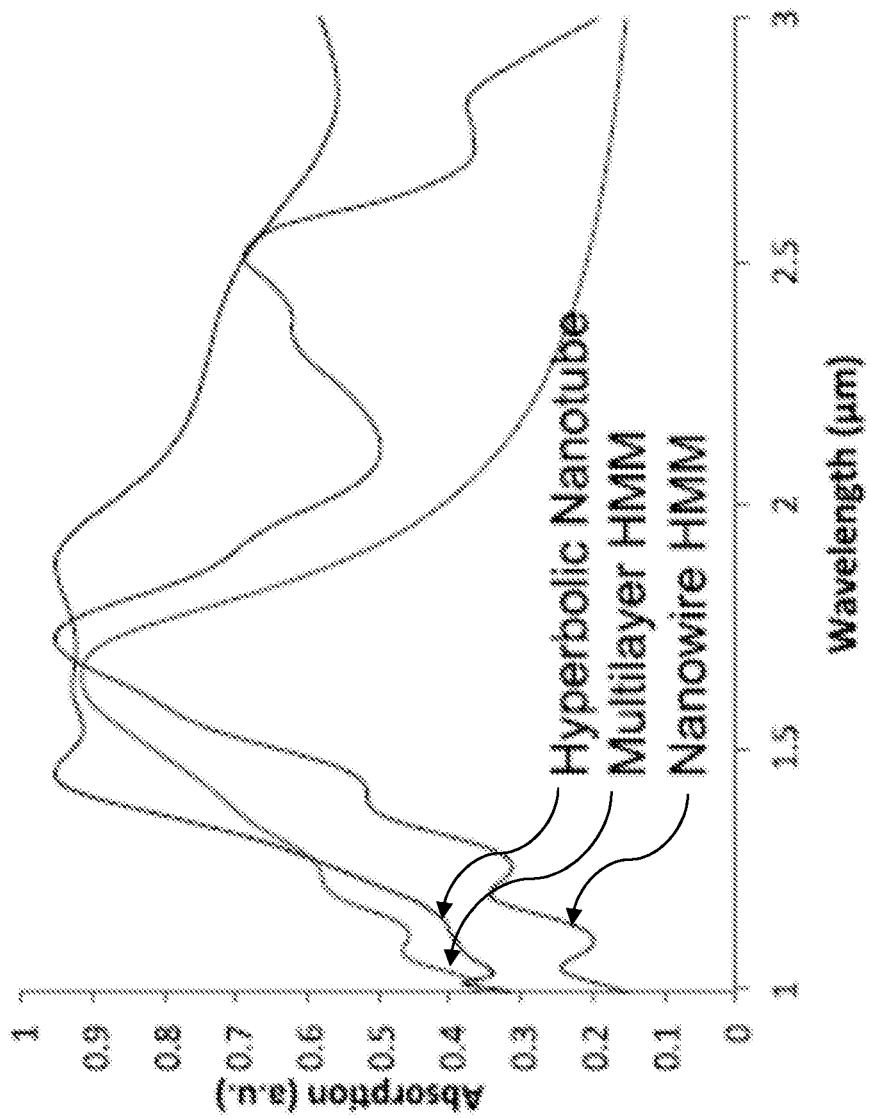

FIG. 5(A) shows examples of simulated absorption of HNTs with increasing n from 1-8 and 13 with a constant inter-pillar gap distance. As n decreases from 8 to 1 with constant g, the broadband absorption separates into two peaks at 1.45 μm and somewhere between 2-3 μm. FIG. 5(B) shows simulated absorption of exact structure HNT arrays with varying a and constant Dt. FIG. 5(C) shows simulated absorption of EMA solid hyperbolic nanowire arrays of varying diameter. FIGS. 5(D) and 5(E) shows simulated absorption using the exact structure of HNTs with varying (D) lengths and (E) ffm in the shell. FIG. 5(F) shows simulated absorption using the exact structure of common HMMs compared with the HNTs.

Broadband absorption occurs when there are a sufficient amount of periods (>~6) within an HMMP as shown in FIG. 5(A) and when the particles are closely packed. This is due to the coalescence of absorption arising from the coalescence of surface/bulk plasmons and lossy hyperbolic modes. The lossy hyperbolic modes occur at longer wavelengths since only the longer wavelengths can be tuned by adjusting the filling fraction, ffm, of the plasmonic material. In addition, the shorter wavelength peak is held constant at 1.4 μm which corresponds to the epsilon zero crossing wavelength of the plasmonic material and is therefore attributed to surface/bulk plasmons. Longer wavelength absorption is due to scattering from surface roughness.

Existing absorbers are either thick, non-transferrable and/or non-selective. The absorbers described herein can operate within relatively wide bands (>600 nm) with over 90% absorption and max absorptions of above 98%. The materials created have high absorption of both transverse-electric (TE) and transverse-magnetic (TM) modes at angles greater than 50°. The material system can also be chosen to withstand high temperatures and corrosive environments. Further, the materials are comprised of particles allowing them to be transferred and operate on any substrate. This allows for greater control over selectivity and flexibility.

As mentioned above, the broadband absorption is due to the coalescence of multiple absorption peaks. As shown in FIG. 5(A), as n decreases from 8 to 1 with constant g, the broadband absorption separates into two peaks at 1.45 μm and about 2-3 μm. Moreover, when n and Dt are held constant, but a is increased from 770 nm to 3500 nm, a deconvolution of the peaks may be observed as shown in FIG. 5(B). The effects of varying Dt can be demonstrated by using the EMA to eliminate the effect of n and replace the air core with the effective medium. Using solid HMM nanowires, no significant effect on the absorption band is observed when Dt is varied from 740 nm to 260 nm with constant g as shown in FIG. 5(C). Simulations also show that the length of the HNTs does not contribute much to the absorption when greater than 1.5 μm. However, at lengths smaller than 1.0 μm the absorption decreases due to increased transmission.

Broadband absorption is achieved when there is a sufficient number of periods and when the HNTs are packed close enough to allow strong resonance coupling. Physically, g is responsible for the intercoupling of the HNTs and n is responsible for the number of higher order plasmon-polaritions modes supported by the HMM. The bandwidth of high wavevector modes supported by the HMM depends upon p but not n. As n increases, however, the discrete modes supported by the HMM may coalesce. Due to the high losses, the discreteness vanishes and a single absorption band appears. The shorter wavelength peak located at 1450 nm corresponds to the zero point (cross-over wavelength) in the real permittivity of AZO and shows little tunability.

Therefore, the short wavelength peak arises due to excitation of bulk and/or surface plasmon-polaritons in the AZO. Conversely, the longer wavelength peak intensifies as n gets larger as shown in FIG. 5(A). Importantly, the accuracy of EMA increases with a larger number of periods and only the long wavelength peak changes with the AZO filling fraction, ffm. Additionally, as air gaps are introduced into the HMM, the system evolves into a photonic hypercrystal which supports additional modes and allows for additional absorption band tailoring.

The mechanism for absorption can be better appreciated by examining the dispersion of the AZO/ZnO/air system analytically. Absorption may occur through the excitation of bulk plasmon polaritions that are supported by the periodic AZO/ZnO/air system. Due to the high losses, all excited modes may eventually dissipate, contributing to absorption. Therefore, absorption occurs at frequencies for which the system supports modes. Because material system is highly dispersive, traditional methods for computing the entire 2D band structure, such as the plane wave expansion method or FDTD, are unreliable and inefficient. To address this complication, a number of simplifying assumptions may be made. Namely, we ignore losses and approximate the entire structure as a 1D photonic hypercrystal with variable air gap, g. While ignoring the center air hole and excitation of modes traveling along the length of the HNT, our assumptions provide a first-order description of the actual system and yields results qualitatively consistent with the experimental absorption spectra.

Propagation of electromagnetic waves through periodic media is conveniently described using Bloch's Theorem. Because the layer thicknesses of the AZO/ZnO HMM are deeply subwavelength, effective medium theory may be used to treat the HMM as a homogeneous uniaxial layer. The general formalism for wave propagation through periodic anisotropic layers for arbitrary angles of incidence and arbitrary orientation of optical axes is rather complex and necessitates numerical solution of a 4×4 matrix problem with complex coefficients. However, for the case of a periodic system consisting of one uniaxial and one isotropic layer, with the optical axis of the uniaxial layer aligned with the optical axis of the bilayer, the problem resembles an isotropic-isotropic periodic system with an angle-dependent permittivity included in the dispersion relation for TM waves.

The wave-vector component parallel to the optical axis of the system, k∥, for both TM and TE polarizations may be determined as a function of the transverse wave-vector component, $k^\perp$, and vacuum wavelength, λ0. The dispersion relations of a 1D infinitely periodic uniaxial-isotropic system, with period length, a, are:

$$k_{\|,TE}(\lambda_0, k_\perp) = \frac{1}{a}\cos^{-1}\left(\frac{A_{TE}+D_{TE}}{2}\right) \quad \text{Eq. (10)}$$

$$k_{\|,TM}(\lambda_0, k_\perp) = \frac{1}{a}\cos^{-1}\left(\frac{A_{TM}+D_{TM}}{2}\right) \quad \text{Eq. (11)}$$

where $$A_{TE} = \exp(ik_{\|,TE(H)}d_H) \quad \text{Eq. (12)}$$
$$\left[\cos(k_{\|,0}d_0) + \frac{i}{2}\left(\frac{k_{\|,0}}{k_{\|,TE(H)}}+\frac{k_{\|,TE(H)}}{k_{\|,0}}\right)\sin(k_{\|,0}d_0)\right]$$

$$D_{TE} = \exp(ik_{\|,TE(H)}d_H) \quad \text{Eq. (13)}$$
$$\left[\cos(k_{\|,0}d_0) - \frac{i}{2}\left(\frac{k_{\|,0}}{k_{\|,TE(H)}}+\frac{k_{\|,TE(H)}}{k_{\|,0}}\right)\sin(k_{\|,0}d_0)\right]$$

$$A_{TM} = \exp(ik_{\|,TM(H)}d_H) \quad \text{Eq. (14)}$$
$$\left[\cos(k_{\|,0}d_0) + \frac{i}{2}\left(\frac{\varepsilon_{TM(H)}(\theta)k_{\|,0}}{\varepsilon_{air}k_{\|,TM(H)}}+\frac{\varepsilon_{air}k_{\|,TE(H)}}{\varepsilon_{TM(H)}(\theta)k_{\|,0}}\right)\sin(k_{\|,0}d_0)\right]$$

$$D_{TM} = \exp(-ik_{\|,TM(H)}d_H) \quad \text{Eq. (15)}$$
$$\left[\cos(k_{\|,0}d_0) - \frac{i}{2}\left(\frac{\varepsilon_{TM(H)}(\theta)k_{\|,0}}{\varepsilon_{air}k_{\|,TM(H)}}+\frac{\varepsilon_{air}k_{\|,TE(H)}}{\varepsilon_{TM(H)}(\theta)k_{\|,0}}\right)\sin(k_{\|,0}d_0)\right]$$

In equations (12)-(15), the longitudinal wave-vector components are:

$$k_{\|,TE(H)} = \sqrt{\varepsilon_\perp k_0^2 - k_\perp^2} \quad \text{Eq. (16)}$$

$$k_{\|,TM(H)} = \sqrt{\varepsilon_\perp\left(k_0^2 - \frac{k_\perp^2}{\varepsilon_\|}\right)} \quad \text{Eq. (17)}$$

with k0=2π/λ0. The effective permittivity elements, $\varepsilon\_\perp$ and $\varepsilon\_\|$, are given by eqns. 4 and 5 and $k^\perp$ is an independent, purely real-valued variable. Also, $\varepsilon_{air}$=1 is the permittivity of air, dH and d0 are the lengths of the uniaxial HMM and isotropic air layers, respectively, and k_(∥,0)=(k_0^2−k_⊥^2)^(½). The photonic hypercrystal (PhHC) described here has a period of a=dH+d0. Finally, the angle-dependent permittivity element of equations (14)-(15) are defined as:

$$\varepsilon_{TM(H)}(\theta) = \sqrt{\varepsilon_\|^2\cos^2\theta + \varepsilon_\perp^2\sin^2\theta} \quad \text{Eq. (18)}$$

where, $$\theta \equiv \cot^{-1}\left(\frac{k_{\|,TM(H)}}{k_\perp}\right) \quad \text{Eq. (19)}$$

For waves propagating normal to the layer interfaces, θ=90°, the TM and TE modes are degenerate.

Figure 6:
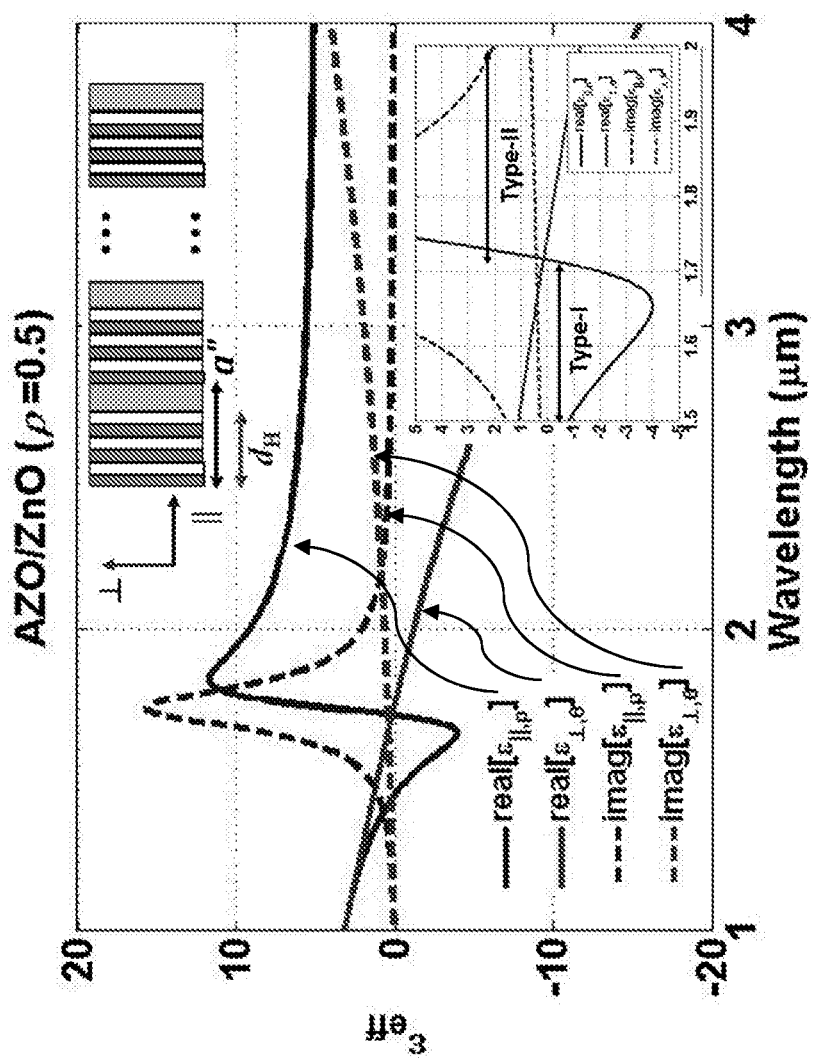
FIG. 6 shows effective material dispersion.

FIG. 6 shows effective material dispersion. Equations 7 and 8 are AZO-ZnO uniaxial multilayer HMM with ffm=0.5. Upper inset shows the structure with the definition of parallel and normal directions with respect to the optical axis of the multilayer that is homogenized. Lower inset is a magnified plot of the transition between type I and type II hyperbolic dispersion for the TM modes. The structure implemented based on the disclosed technology is shown schematically in FIG. 6. Also shown is the effective permittivity elements of the AZO/ZnO HMM parallel and normal to optical axis of the system, which is normal to the layer interfaces. All calculations here use a constant metallic filling fraction, ffm=0.5. From effective medium theory, the HMM exhibits type-I hyperbolic dispersion for 1450 nm<λ0<1720 nm and type-II hyperbolic dispersion for λ0>1750 nm for TM modes, i.e., modes with an electric field component normal to the layer interfaces. Dispersion is elliptical for λ0<1450 nm for both TM and TE modes. In the type-I and type-II hyperbolic regimes, TE modes are elliptical and not supported, respectively.

As a increases with a fixed dH, the fill fraction of the HMM in the PhHC becomes smaller. This corresponds to the experimental situation of a decreasing hyperbolic nanotube fill fraction, $ff_{HNT}$, which we define as:

$$ff_{HNT} = \frac{\pi}{6\sqrt{3}}\frac{D_t^2}{a^2} \quad \text{Eq. (20)}$$

Compared to PhHCs with a=1500 nm, a=2500 nm, and a=3500 nm, a PhHC with a=770 nm has a ffHNT 4×, 11×, and 21× greater, respectively. Therefore, a naive prediction would assume that the close-packed PhHC with a=770 nm has 4×, 11×, and 21× greater absorption at a given wavelength which is not observed in the numerical simulations displayed in FIG. 4(B).

Figure 7:
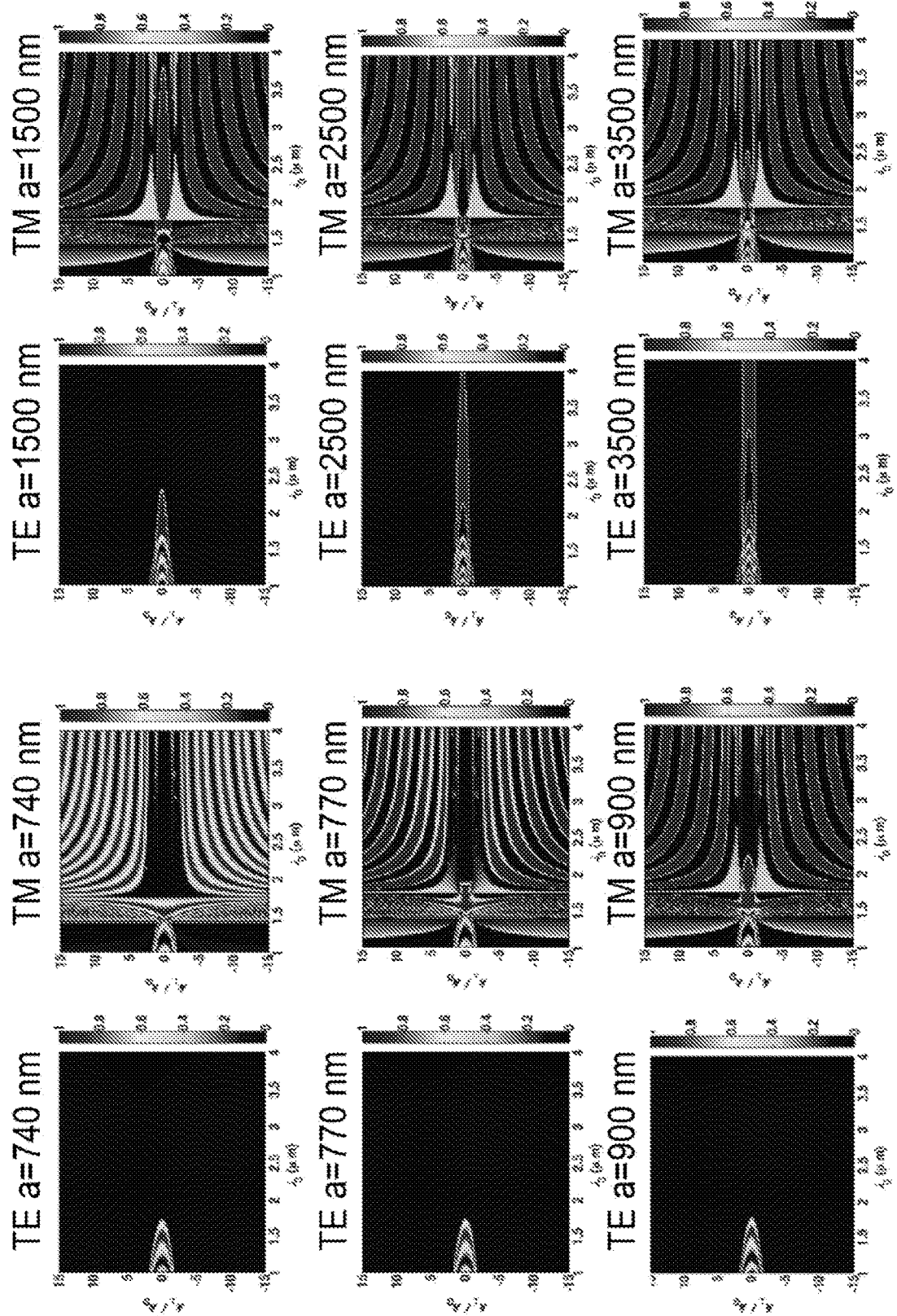
FIG. 7 compares a photonic hypercrystal (PhHC) of constant dH=740 nm and 'a' increasing from 740 nm to 3500 nm.

FIG. 7 compares a PhHC of constant dH=740 nm and a increasing from 740 nm to 3500 nm as a function of both $\lambda_0$ and $k^\perp$. Here, the existence of type-I and type-II hyperbolic dispersion may be observed. Stop bands in the PhHC may also be observed as a increases in the type I regime for $k^\perp/k_0 < 1$ and in the type II regime for $k^\perp/k_0 > 1$. Pass bands in the PhHC may also be observed as a increases in the type II regime for $k^\perp/k_0 < 1$.

Despite the appearance of bandgaps during the formation of the PhHC, additional modes also appear. These modes are responsible for the larger-than-expected absorption of the PhHC with large a, particularly in the type-II regime. The prediction based on HNT density does not account for the appearance of additional modes as the HMM evolves in the PhHC. These features correlate well with the numerical simulation presented in FIG. 5(B).

Based on these results, it is clear that the absorption spectrum depends upon both the wavelength-scale periodicity of the hypercrystal and the deeply sub-wavelength scale of the HMM. The simultaneous control of these structural parameters enables a tailorable absorption spectrum unachievable in other systems, such as self-aligned carbon nanotubes. Therefore, the near-perfectly absorbing photonic hypercrystal represents a new platform for tailor-made manipulation of light. While we have demonstrated this effect using AZO, ZnO, and air in the near-infrared, we stress that our methodology is general, and may be applied to myriad material systems across the electromagnetic spectrum.

Figure 8:
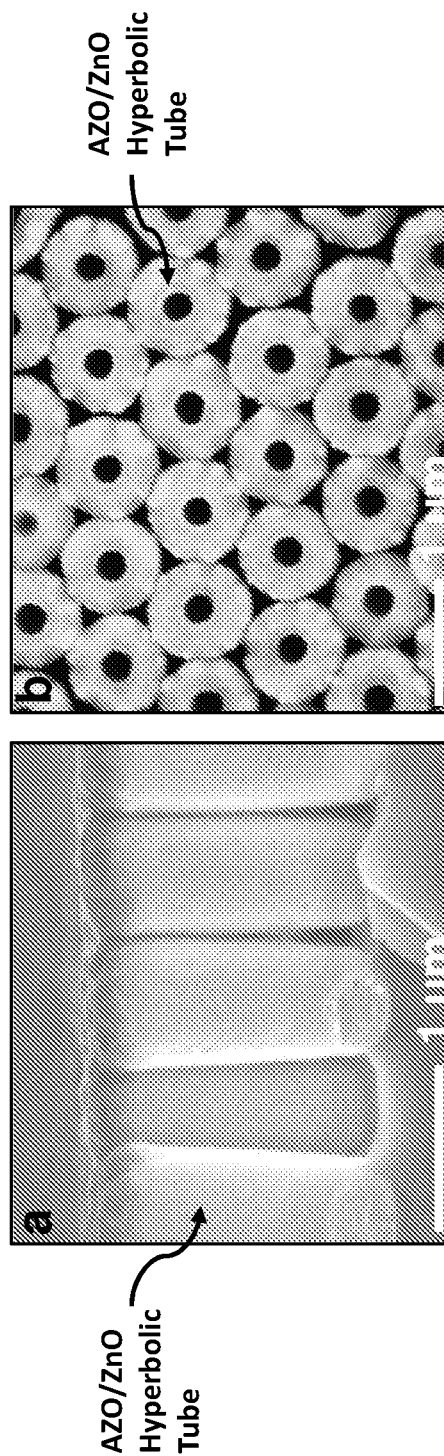
FIG. 8 shows scanning electron microscope (SEM) images of the HNT arrays as viewed in the plane (a) parallel and (b) perpendicular to the nanotube axis.

FIG. 8 shows SEM images of the HNT arrays as viewed in the plane (a) parallel and (b) perpendicular to the nanotube axis. As can be seen here, the HNT array implemented based on the disclosed technology may have a closely packed triangular geometry.

Broadband and selective absorption has been experimentally demonstrated for the AZO/ZnO hyperbolic tubes made by depositing AZO/ZnO HMM films grown by atomic layer deposition. Absorption over 90% is observed from 1400-2400 nm with a maximum absorption >98% at 1550 nm for hyperbolic nanotubes whereas solid AZO nanotubes are shown to have less absorption within a smaller band. The absorption band can also be tuned by changing parameters that can tune the carrier concentration of the plasmonic material. This is also demonstrated for AZO/ZnO hyperbolic tubes where the atomic layer deposition reactor temperature is adjusted from 200° C. to 185° C. to adjust the absorption window.

Figure 9:
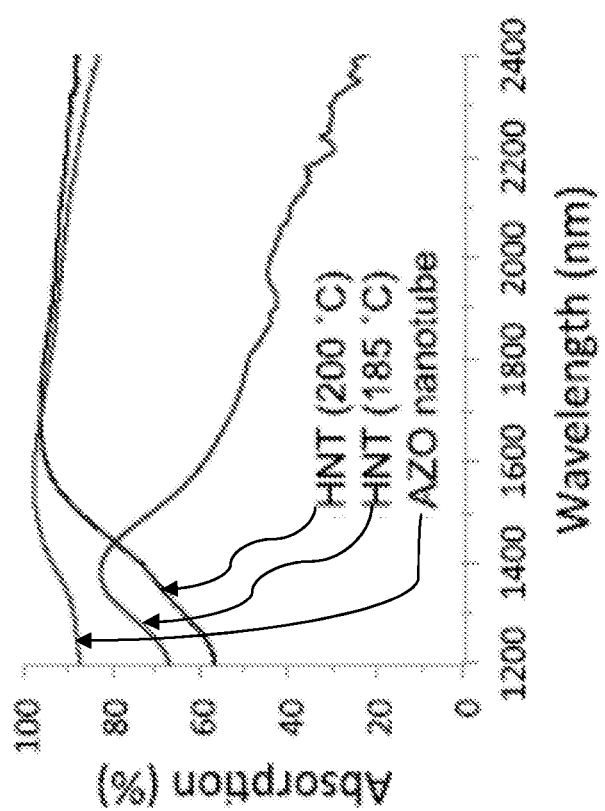
FIG. 9(A) shows absorption spectra of HNT arrays deposited at a temperature of 185° C. and 200° C. along with a spectrum of a pure aluminum-doped zinc oxide (AZO) nanotube array deposited at 200° C.
FIG. 9(B) illustrates schematic of the incident radiation at angle θ showing transverse-electric (TM) polarization.
FIGS. 9(C) and 9(D) show wide-angle absorption spectra for (C) TM and (D) transverse-magnetic (TE) polarizations of an HNT array deposited at 200° C.
Figure 9:
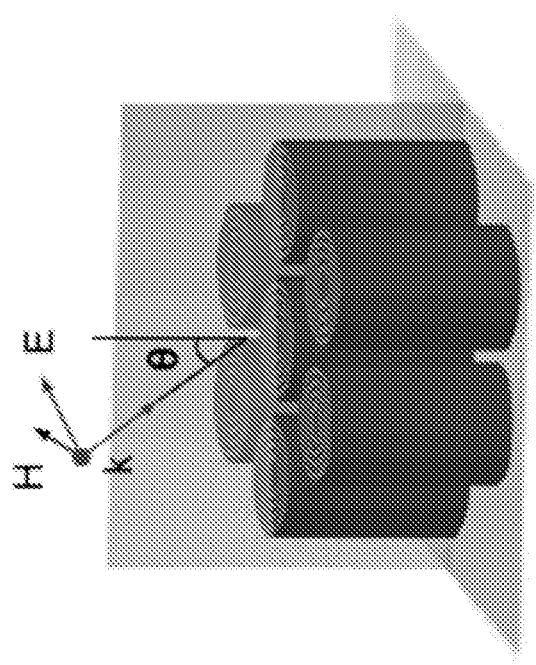
Figure 9:
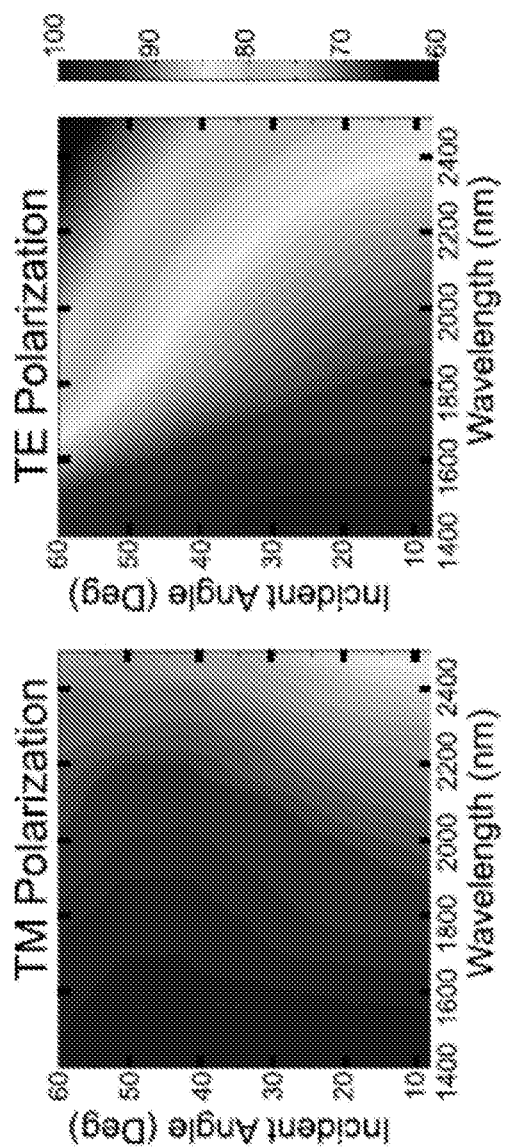

The hyperbolic tubes also show a wide absorption angle as shown in FIGS. 9B and 8C. FIG. 9(A) shows absorption spectra of HNT arrays deposited at a temperature of 185° C. and 200° C. along with a spectrum of a pure AZO nanotube array deposited at 200° C. FIG. 9(B) shows a schematic of the incident radiation at angle θ showing TM polarization. Wide-angle absorption spectra are shown in FIGS. 9(C) and 9(D) for (C) TM and (D) TE polarizations of an HNT array deposited at 200° C. The color corresponds to the percent absorption.

Broadband absorption of above 87% from 1,200 nm to over 2,200 nm is demonstrated with a maximum absorption of 98.1% at 1,550 nm for a Td of 200° C. For a Td of 185° C., broadband absorption of above 87% is observed from 1,500 nm to over 2,200 nm with a maximum absorption of 96.3% at 1,700 nm. As a control, pure AZO nanotubes are also plotted, which exhibit only a modest absorption maximum of 82.5% at 1,400 nm with a narrow spectral width. As can be seen in FIG. 9A, The HNTs show excellent selectivity by displaying increased reflection at longer wavelengths. This is due to an increased impedance mismatch as the real permittivity of AZO becomes increasingly negative at longer wavelengths. The angular dependence may be demonstrated by sputtering a 100-nm gold film on the back of the silicon. This may allow only the specular reflectance to be considered when calculating the absorption [absorption (%)=100%−reflectance (%)]. This method may be valid within 1% from 1,500 to 2,400 nm and within 6% from 1,400 to 1,500 nm.

As shown in FIGS. 9(C) and 9(D), the HNTs possess omnidirectional absorption for both TE and TM polarizations. For TM polarization, the absorption is maintained above 85% at all angles and wavelengths measured. For TE polarization, the absorption is diminished at higher angles and longer wavelengths. However, an absorption of >70% is maintained across the measured wavelengths and angles smaller than 50°.

Figure 10:
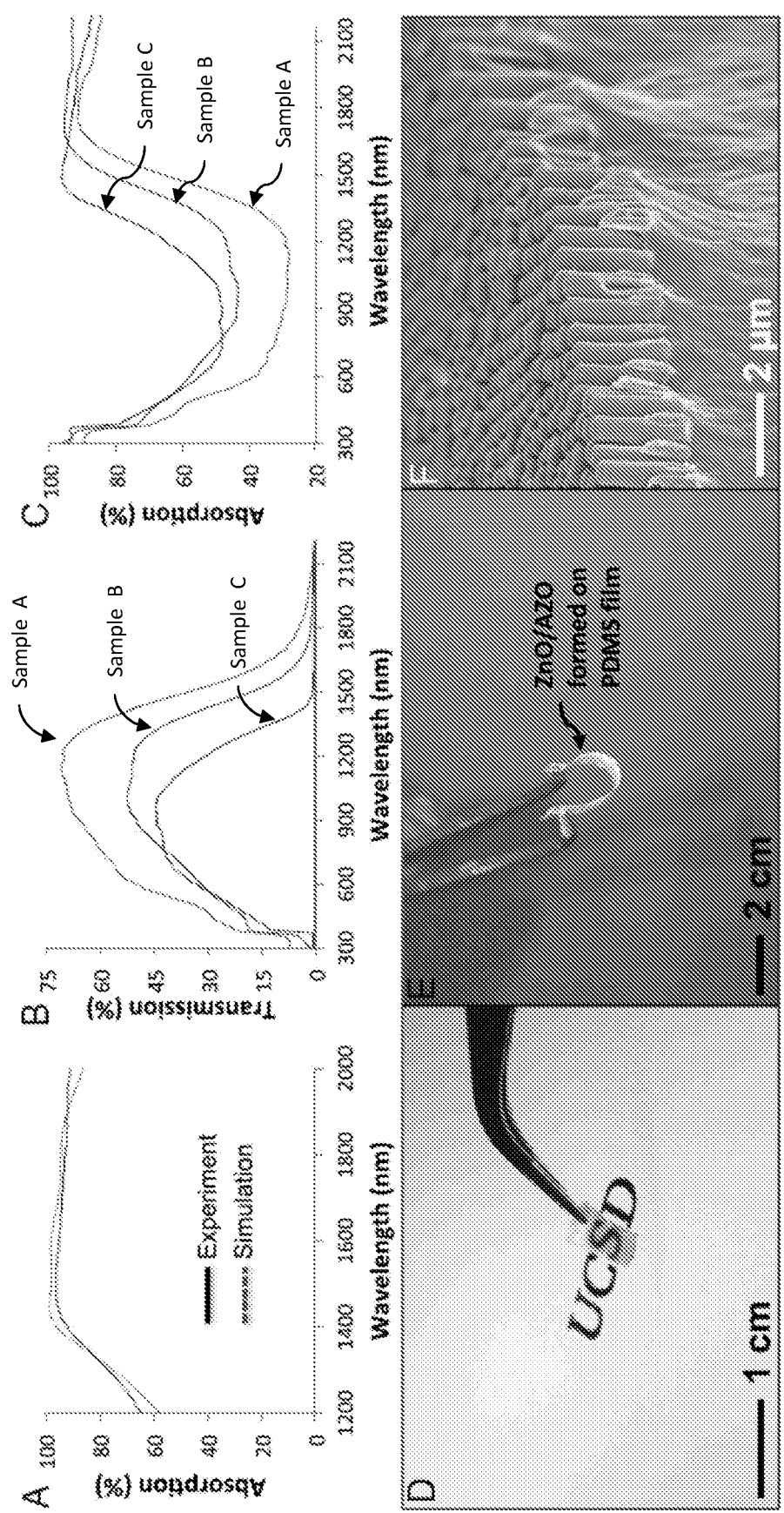
FIG. 10(A) shows comparison of experimental and simulated absorption spectra for sample A.
FIG. 10(B) shows transmission.
FIG. 10(C) shows absorption spectra for samples A-C with parameters as described in Table 1 after flexing several times as shown in FIG. 10(E).
FIGS. 10(D) and 10(E) show photographs of sample A showing (D) visible transparency and (E) mechanical flexibility.
FIG. 10(F) shows SEM image of an HNT array (Sample B) after transferring to a flexible polydimethylsiloxane (PDMS) substrate and flexing several times as shown in FIG. 10(E).

FIG. 10(A) shows a comparison of experimental and simulated absorption spectra for the sample A of Table 1 below. FIGS. 10(B) and 10(C) show examples of transmission and absorption spectra for samples A-C with parameters as described in Table 1 after flexing several times as shown in FIG. 10(E). FIGS. 10(D) and 10(E) are photographs of the sample A showing visible transparency (D) and mechanical flexibility (E). FIG. 10(F) shows an example SEM image of an HNT array (Sample B of Table 1) after transferring to a flexible PDMS substrate and flexing several times as shown in FIG. 10(E).

The particles can also be transferred to a more desirable substrate. This is demonstrated in FIG. 10 where the hyperbolic tubes deposited are transferred to a polydimethylsiloxane (PDMS) substrate with parameters described in Table 1.

The HNT arrays implemented based on the disclosed technology operate as a standalone material even after being removed from the growth substrate. The arrays may be transferred to a thin, flexible, and visibly transparent substrate by spin coating 60 μm of polydimethylsiloxane (PDMS) onto the top of the arrays and removing the silicon via reactive ion etching (RIE). This may be carried out for three different arrays with various parameters as described in Table 1 below and observed from direct imaging. Referring to FIG. 10(A), the absorption spectra of sample A and a simulated exact structure (with a similar structure to sample A, but with a rounded top to replicate experimental conditions) have excellent agreement. This suggests that the shorter wavelength discrepancy between the simulated and experimental absorption described earlier is due to the silicon substrate either from reflection back into the HNTs or absorption of the textured surface created during the HNT fabrication. FIGS. 10(B) and 9(C) illustrate the transmission and absorption spectra of the three samples to show that a large transmission window is observed from 500 to 1,300 nm, with the broadest IR absorption band belonging to sample A at the expense of a narrower and weaker transmission window. The transmission can be slightly increased by lowering Td and keeping the geometry constant, but the largest gain in transmission is observed when L is decreased and g is increased (sample C). Because all of the constituent materials (AZO, ZnO, and PDMS) in the free-standing HNT array have large optical transparencies throughout the visible, and reflection accounts for below 12% of the decreased transparency, the additional absorption stems from silicon contaminates left over from the transfer process and/or subband levels (defects states) in the ZnO/AZO layers. With further refinement in the synthesis, etching, and transferring steps, it is anticipated that a significant improvement can be made in the visible transparency. After transferring the HNT array to the PDMS film, they can be reproducibly flexed while still maintaining their excellent broadband absorption in the near IR (NIR), and transmission in visible, as well as their physical interface with the polymer (FIGS. 10D-10F).

TABLE 1

Parameters of Samples A-C

| | L (μm) | $D_t$ (nm) | $D_c$ (nm) | n | $t_m$ (nm) | $t_d$ (nm) | p (nm) | a (nm) | g (nm) | $T_d$ (° C.) |
|---|---|---|---|---|---|---|---|---|---|---|
| A | 2.05 | 700 | 220 | 12 | 10 | 10 | 20 | 770 | 70 | 200 |
| B | 2.05 | 700 | 220 | 12 | 10 | 10 | 20 | 770 | 70 | 185 |
| C | 1.39 | 620 | 140 | 12 | 10 | 10 | 20 | 770 | 150 | 185 |

Here, the absorption is well simulated by finite-difference time domain (FDTD) simulations as shown in FIG. 10(A). The transmission window is observed from 500 nm to 1300 nm as shown in FIG. 10(B). Further, experimental absorption is still maintained above 90% at telecommunication wavelengths as shown in FIG. 10(C).

Figure 11:
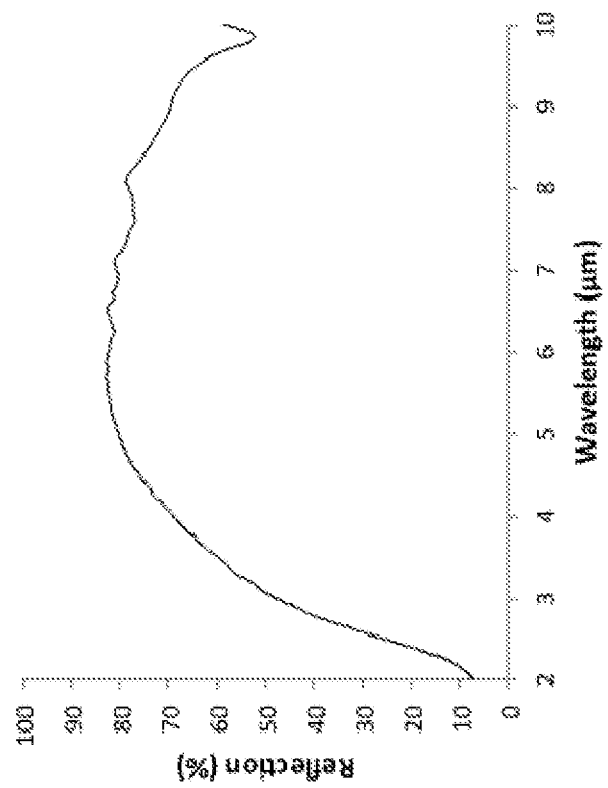
FIG. 11 illustrates an example infrared (IR) reflection spectrum of an HNT array.

FIG. 11 shows an example infrared (IR) reflection spectrum of an HNT array. It can be seen that selectivity is observed by increased reflection at wavelengths over 2 μm.

Figure 12:
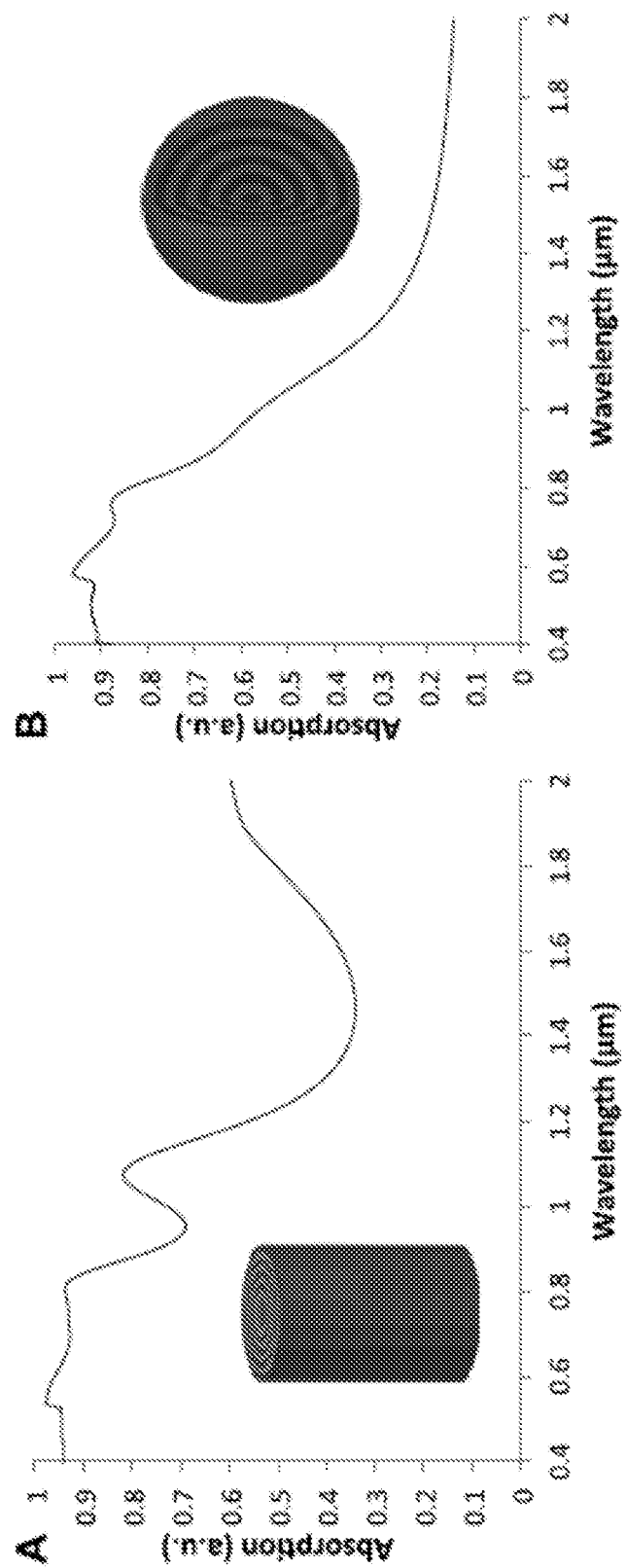
FIG. 12 depicts an example of a simulated absorption spectra of a closely packed TiN/(Al,Sc)N based (A) HNT array and (B) hyperbolic nanosphere array. The HNT array parameters L, Dt, Dc, g, a, n, tm and td used in the simulation were 750 nm, 500 nm, 60 nm, 30 nm, 530 nm, 11, 10 nm, and 10 nm, respectively. The Dt, Dc, g, a, n, tm, and td used for the hyperbolic nanosphere simulation were 540 nm, 60 nm, 30 nm, 570 nm, 12, 10 nm and 10 nm, respectively.

FIG. 12 shows an example of a simulated absorption spectra of a closely packed TiN/(Al,Sc)N based HNT array as shown in FIG. 12(A) and hyperbolic nanosphere array (FIG. 12B). The HNT array parameters L, Dt, Dc, g, a, n, tm and $t_d$ used in the simulation were 750 nm, 500 nm, 60 nm, 30 nm, 530 nm, 11, 10 nm, and 10 nm, respectively. The Dt, Dc, g, a, n, tm, and $t_d$ used for the hyperbolic nanosphere simulation were 540 nm, 60 nm, 30 nm, 570 nm, 12, 10 nm and 10 nm, respectively.

Simulations also reveal that these materials can use alternative materials to operate in other spectra such as the visible. Beyond the AZO/ZnO HNT system, selective and broadband absorption can be applied to many other material systems and geometries. For example, the TiN/(Al,Sc)N material system may produce high-quality epitaxial HMMs with refractory qualities. This is demonstrated with the TiN/(Al,Sc)N system for both the nanotube and nanosphere geometries. As seen in FIG. 12, these materials can provide over 90% absorption throughout the entire visible spectrum.

THMMP arrays with these materials could be advantageous for applications such as thermophotovoltaics (TPV) and visible emitters that require many cycles at elevated temperatures (>1,000° C.). Some existing work in this area focuses on nonselective absorbers and plasmonic metamaterial. These planar materials, however, either lose efficiency due to parasitic radiation at higher temperatures or can crack and delaminate due to thermal expansion mismatch between the absorber layer and substrate. A major advantage of a THMMP array is that it has a reduced substrate contact area that minimizes the impact of thermal expansion mismatches and would allow for a wider selection of substrates to be used while promoting the use of facile transfer techniques. Simulations reveal that TiN/(Al,Sc)N based HNT arrays (L=750 nm, Dt=500 nm, Dc=30 nm, n=11, tm=$t_d$=10 nm, a=530 nm) have absorption values of above 93% throughout the entire visible spectrum while suppressing absorption at longer wavelengths as shown in FIG. 12(A). In comparison with the HNT geometry, closely packed hyperbolic nanospheres may be particularly useful because they are expected to have less angular dependence and can be deposited onto substrates via low-cost/scalable processes such as nanoparticle self-assembly and spray-on techniques. Simulations also reveal that these types of arrays made from a TiN/(Al,Sc)N material system have a large absorption (e.g., above 89% throughout the entire visible spectrum) while suppressing absorption in the NIR with only a 540-nm-thick single monolayer as shown in FIG. 12(B). In addition, potential uses of the material include thermal/visible emitters, absorbers/heat exchangers, thermophotovoltaics and camouflage material.

In some embodiments, a layered metamaterial structure comprising a first layer including a dielectric material and a second layer including a plasmonic material may be used for the described application. The plasmonic material has a carrier concentration that exhibits plasmons in a target operating frequency band. In some embodiments, the structure may be an array that includes spherical or cylindrical nanoparticles. The structure may include five or more alternating layers of AZO and ZnO or other similar compounds exhibiting dielectric and/or plasmonic properties. Here, the plasmonic properties may be exhibited in a target operating frequency band including 1,550 nm wavelength. In an embodiment, the structure comprises one or more spherical nanoparticles in which a number of concentric first and second layers alternate with each other. In another embodiment, the structure comprises one or more cylindrical nanotubes comprising coaxial layering of the first layer and the second layer along a longitudinal axis. Here, the structure may further include an air core at the longitudinal axis. In an embodiment, the structure may have a dimension that is between 200 nm and 1 micrometer.

In some embodiments, a method of fabricating an array of nanoparticle structures includes generating a silicon hole array template using nanosphere lithography, filling in holes of the silicon hole array using atomic layer deposition by multilayered structures of hyperbolic metamaterials (HMMs), etching, using a reactive ion etching process, a top layer of result of the filling operation, thereby exposing underlying silicon of the silicon hole array, and removing silicon surrounding hyperbolic metamaterial to leave behind an array of packed multilayered structures of HMMs. Here, the multilayered structures of HMMs include a plurality of spherical nanoparticles in which a number of layers of concentric aluminum zinc oxide (AZO) and zinc oxide (ZnO) alternate with each other. The multilayered structures of HMMs may include at least five layers. Here, in fabricating the nanoparticle structures, Transparent Conduction Oxide (TCO), Doped Oxide layers, Aluminum Zinc Oxide (AZO), Indium Tin Oxide (ITO), or Titanium Nitride (TiN) may be used.

Figure 13:
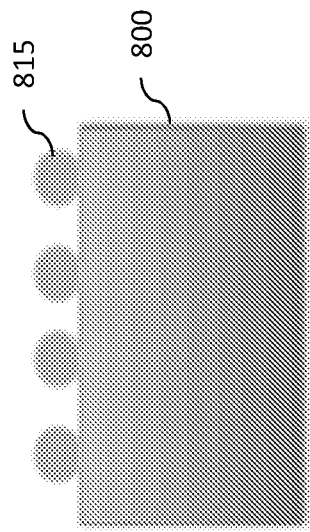
FIGS. 13(A) to 13(I) are cross-section diagrams that show an example HNT fabrication process.
Figure 13:
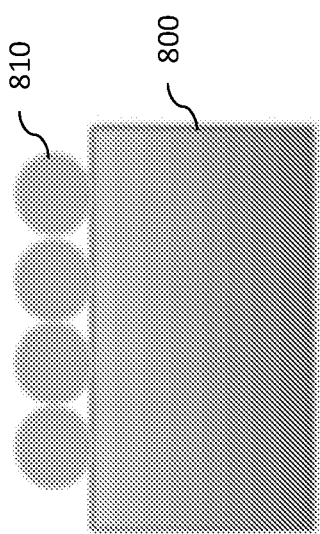
Figure 13:
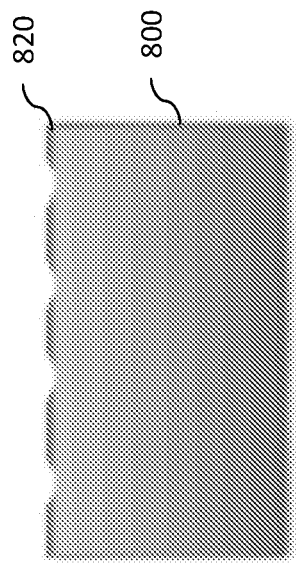
Figure 13:
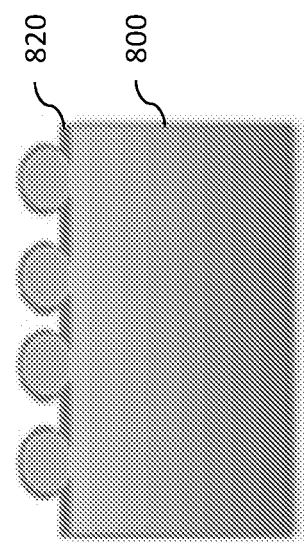
Figure 13:
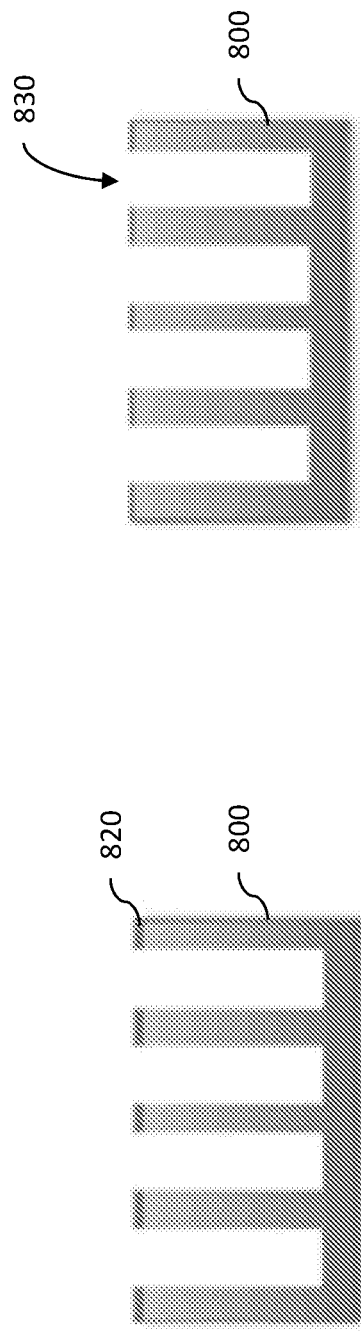
Figure 13:
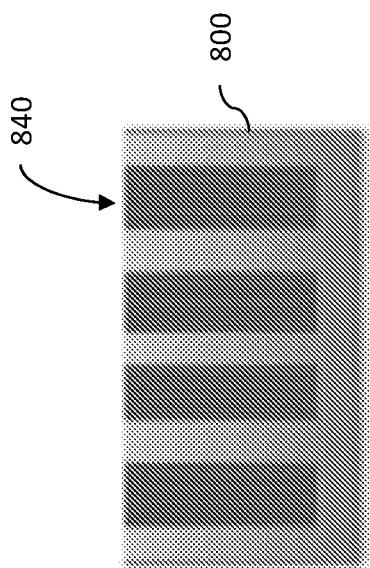
Figure 13:
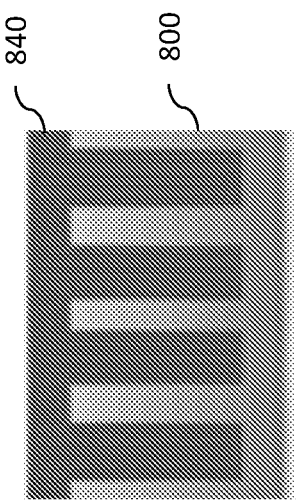
Figure 13:
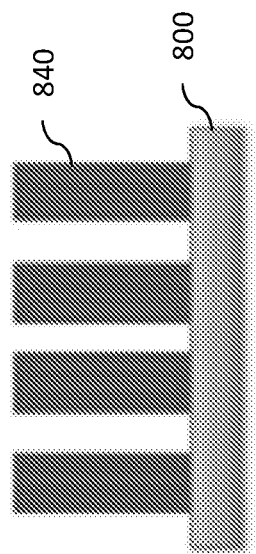

FIGS. 13(A) to 13(I) are cross-section diagrams that show an example HNT fabrication process. In some embodiments, HNT arrays may be fabricated using silicon nanohole templates created by nanosphere lithography. In FIG. 13(A), a silicon dioxide ($SiO_2$) sphere 810 is formed on a substrate (e.g., silicon substrate) 800. For example, Stöber particles (770-nm diameter) may be grown from standard processes and used as a nanosphere mask. Next, the Stöber particles may be functionalized with 3-aminopropylmethyldiethoxysilane (APMDES), cleaned, and deposited onto p-type, double-sided polished, prime silicon using a Langmuir Blodgett trough. In FIG. 13(B), a reactive ion etching (RIE)

process may be performed using CHF3 and Ar gases to reduce the size of the silicon dioxide particles 810 formed on the substrate 800 to a desired size of a silicon dioxide sphere 815. In FIG. 13(C), a nickel film 820 may be deposited on the resulting structure using an electron beam evaporator. For example, 45-nm-thick nickel film may be deposited. In FIG. 13(D), the silicon dioxide spheres 815 are chemically or mechanically removed. In FIG. 13(E), using SF6 and C4F8 gases, the exposed silicon may be etched to create the nanohole template. After removing the nickel mask using TFB nickel etchant as shown in FIG. 13(F), the ZnO/AZO HMM may be deposited into the nanoholes with an atomic layer deposition (ALD) system operating at a reactor temperature of, e.g., 185 or 200° C., as shown in FIG. 13(G). In an embodiment, diethylzinc, trimethylaluminum, and deionized water may be used as the zinc, aluminum, and oxygen sources, respectively. For example, the Zn:Al pulse ratio for the AZO films may be kept constant at 20:1 for all experiments. The film thicknesses may be first determined for each material on planar silicon substrates by ellipsometry at each deposition temperature. In an embodiment, a total HMM thickness of about 350 nm may be deposited on the nanohole template such that the nanoholes are completely sealed. Here, each individual ZnO and AZO layer may be, e.g., 10 nm. Next, a 20-nm protection layer of HfO2 may be deposited via ALD by using tetrakis (dimethylamido) hafnium(IV) and water as the hafnium and oxygen sources, respectively. After depositing the HMM and protection layer, rapid thermal processing may be carried out to activate the aluminum dopants using a thermal processing equipment with a 1.5 L·min−1 nitrogen flow rate. In FIG. 13(H), the top layers of HfO2 and ZnO/AZO may be removed, e.g., using reactive ion etching (RIE) with CHF3 and Ar gases until the top silicon was exposed. In FIG. 13(I). the exposed silicon may be removed using an etching equipment with SF6 and C4F8 gases, leaving behind the HNT array. The roughened HNTs may be created by additional etching of the HNTs (deposited at a temperature of 200° C.) using RIE with CHF3 and Ar gases. Before measurements, dilute HCl may be applied to the back of the resultant structure to remove any contaminates that may have been generated during the ALD process.

The HNT arrays may be transferred secondary substrates, such as visibly transparent and mechanically flexible substrates, while maintaining their broadband absorption in the NIR. For example, the HNT arrays may be transferred to a flexible polymer film by depositing a 60-μm film of PDMS and etching away the substrate. For example, the PDMS film may be coated on the top of the HNT array by spin coating at 1,000 rpm for 45 seconds and curing at 125° C. for 8 minutes. The etching may be performed using xenon difluoride. The back silicon may then be cleaned with O2 plasma and removed using an etching equipment.

Figure 14:
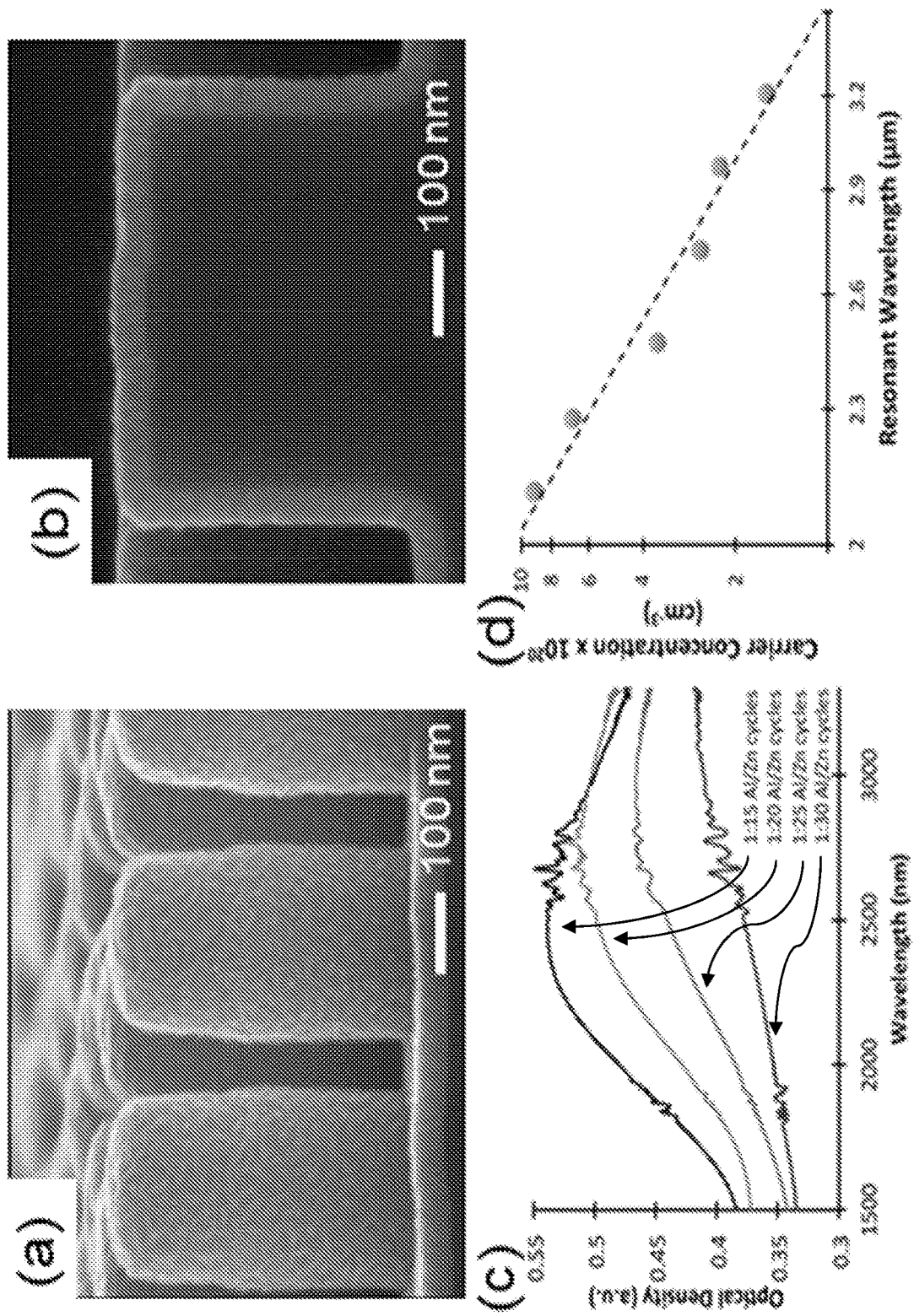
FIG. 14 illustrates (a) scanning electron micrograph of a Si nanopillar array coated with a 56 nm AZO layer deposited via ALD, (b) cross-sectional image of a single Si nanopillar with an AZO coating, (c) IR extinction spectra of AZO-coated Si nanopillars at a constant deposition temperature (200° C.) but varying Al/Zn compositions, (d) log-log plot of carrier concentration vs. resonant wavelength for various AZO-coated Si nanopillar arrays, where the dashed line is the linear relationship expected from a Drude model.

FIG. 14 illustrates (a) scanning electron micrograph of a Si nanopillar array coated with a 56 nm AZO layer deposited via ALD, (b) cross-sectional image of a single Si nanopillar with an AZO coating, (c) IR extinction spectra of AZO-coated Si nanopillars at a constant deposition temperature (200° C.) but varying Al/Zn compositions, (d) log-log plot of carrier concentration vs. resonant wavelength for various AZO-coated Si nanopillar arrays, where the dashed line is the linear relationship expected from a Drude model.

To date, the only synthetic approaches that have been able to fabricate AZO materials with plasmonic responses in the NIR to short-wave IR regions (SWIR) (λ=1.4 to 3 μm) are solution grown nanoparticles and thin films created by pulsed laser deposition (PLD). The nanoparticle strategies have several advantages over PLD-based deposition, specifically in their synthetic simplicity and scalability, but creating more complex shapes and geometries remains a major challenge for both the nanoparticle systems and PLD. There is therefore a strong need to develop novel deposition techniques that can be scaled-up and routinely coat nanoscale features. One of the most versatile deposition techniques to conformally coat large and small features is atomic layer deposition (ALD) which forms controlled monolayers in a systematic fashion through a series of sequential, self-limiting surface reaction. These surface reactions are induced by chemical pulses into the growth chamber which allow pinhole-free films to be fabricated with nanometer thickness resolution. To tune the carrier concentration in ALD-deposited AZO films, one only has to control the frequency at which the aluminum chemical pulses (e.g., trimethylaluminum) are applied.

Recently we demonstrated that ALD can be used to fabricate high-quality plasmonic AZO coatings on silicon nanopillar arrays that can be tuned across the SWIR and NIR wavelengths. The silicon nanopillar arrays were fabricated using nanosphere lithography (NSL). In this technique silica nanoparticles (~200 nm diameters) are transferred to a silicon substrate after being assembled into a close packed geometry with a Langmuir-Blodgett (LB) trough. After shrinking the silica nanoparticles via reactive ion etching (RIE) to expose more of the silicon substrate, RIE is used to etch the underlying silicon. Once the desired etch depth is attained, the silica nanoparticle masks can be removed with a buffered oxide etch and the chip can be placed in the ALD chamber. Various ALD recipes can be used for AZO, but it was found that the best zinc, aluminum and oxygen sources were diethylzinc (DEZ), trimethylaluminum (TMA), and water, respectively, and the optimal deposition temperature ranged from 200° C. to 250° C. The aluminum concentration can be controlled by changing the frequency of the TMA precursor cycle. For example, a film with a ~2 wt % Al/Zn (nominal) can be synthesized using 1 TMA cycle for every 20 DEZ cycles. FIG. 14 shows some images and optical responses of the materials as a function of aluminum doping. Initial findings showed that the lowest crossover wavelength ($\epsilon'=0$, where the material starts to behave like a metal) obtainable was 2160 nm for a 56 nm thick film. These films had a decent loss corresponding to $\epsilon''\approx 2$ but still higher than films deposited by PLD which can reach values of $\epsilon''<1$.

Figure 15:
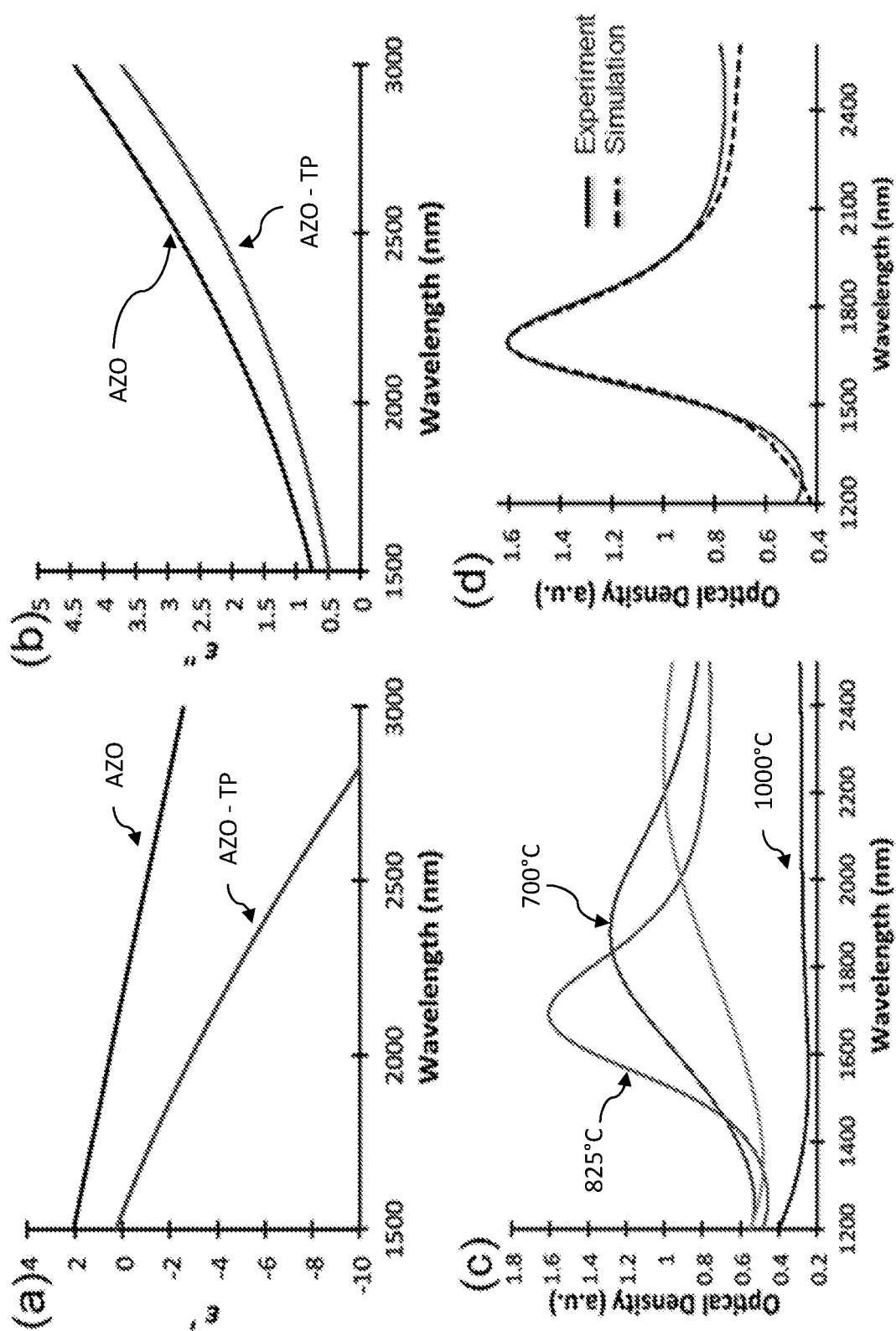
FIG. 15 illustrates (a) real and (b) imaginary dielectric constants of AZO and thermally processed AZO (825° C.) using ellipsometry. Samples are coated with a 12 nm thick HfO2 passivation layer, (c) IR extinction spectra of thermally processed AZO/HfO2 (56/12 nm thicknesses) after depositing on a Si nanopillar array and performing RTP treatment at different temperatures, (d) comparison of experimental and finite-difference time-domain (FDTD) simulation of an AZO/HfO2 (56/12 nm thicknesses) layer coated on a Si nanopillar array.

FIG. 15 illustrates (a) real and (b) imaginary dielectric constants of AZO and thermally processed AZO (825° C.) using ellipsometry. Samples are coated with a 12 nm thick HfO2 passivation layer, (c) IR extinction spectra of thermally processed AZO/HfO2 (56/12 nm thicknesses) after depositing on a Si nanopillar array and performing RTP treatment at different temperatures, (d) comparison of experimental and FDTD simulation of an AZO/HfO2 (56/12 nm thicknesses) layer coated on a Si nanopillar array.

To improve the optical properties of the films, we found that thermal post-processing (>500° C.) via rapid thermal processing (RTP) in combination with a protective oxide (e.g., $HfO_2$) film deposited on top of the AZO lowers the crossover wavelength and reduces the optical loss. FIGS. 15(*a*) and 15(*b*) show the real and imaginary dielectric constants of an as-made sample with a 56 nm thick layer of AZO and a 12 nm thick $HfO_2$ along with the same sample after thermally processing at 825° C. There is a clear blue shift in $\epsilon'$, reaching a crossover wavelength of 1545 nm, and an improved optical loss, reaching values of $\epsilon''<0.5$. These are impressive values that have never been attained with an ALD process before, and are competing with the best PLD films. Referring to FIG. 15(*c*), the IR extinction spectra show how the plasmon resonance is influenced by the RTP treatment as well as the improvement in the quality factor of the resonance. Referring to FIG. 15(*d*), finite-difference time-domain (FDTD) simulations of the plasmonic resonances can also be carried out on the arrays which show excellent agreement with the experimental values.

Although these preliminary results demonstrate that ALD is an excellent deposition technique to produce high-quality, tunable IR plasmonic coatings, we have not reached its full potential. The performance of the THC devices will be intimately coupled with the quality factor and losses associated with the coatings. Therefore we aim to further improve the ALD process by investigating various passivating (on top of the AZO) and buffer layers (between substrate and AZO). This will not only enhance the optical properties of the active materials, but help elucidate the role of these layers. For example, it is believed that the $HfO_2$ passivation layer used in the data for FIG. 15 helps prevent zinc evaporation from the AZO film during the RTP treatment which can reduce the number of the accepting oxygen ($O_i$) defects that ultimately lowers the carrier concentration. However, an increase in the carrier concentration (via Hall measurements) from $1.0 \times 10^{21}$ cm$^{-3}$ before RTP to $1.5 \times 10^{21}$ cm$^{-3}$ after RTP is observed for the passivated AZO samples. Interestingly, this is opposite of the pure ZnO films which show a decrease in carrier concentration from $2.9 \times 10^{19}$ cm$^3$ before RTP to $8.7 \times 10^{18}$ cm$^{-3}$ after RTP. This suggests that there is some activation process of the aluminum dopants. The amount of Al atoms that contribute to free electrons can be significantly lower in ALD than other synthetic techniques. Through an effective field model, it has been proposed that the lower free electrons is due to the unique layer-by-layer configuration in the ALD process which is opposite to PLD, sputtering, and other deposition methods. The close proximity of adjacent Al atoms in the model causes electronic repulsion that suppresses the donation of free electrons. It is possible that the 50% enhancement in the carrier concentration of the AZO after RTP is coming from the diffusion of Al atoms into the ZnO layers creating more random orientations that can support higher free electrons, but we will systematically study this to gain a complete understanding. For example, tools including small angle X-ray diffraction, high-resolution transmission electron microscopy, and electrical characterization will be used on samples with different ALD deposited passivation/buffer layers (e.g., $Al_2O_3$, $HfO_2$, ZnO, TiN, etc.) to correlate the structural and electrical properties with the plasmonic response of the coatings.

In some embodiments, a structure with multilayered metamaterials includes free-floating hyperbolic nanospheres that consist of concentric layers of dielectric and metal. If a colloidal solution or ink comprised of independent HMM nanospheres could be synthesized, this could be used to create specific hyper-crystal coatings on virtually any substrate via spray-on or printing technologies. In addition, there could be new sciences uncovered when extending the 2D multilayer system (e.g., tubes) to a 3D multilayer system.

Figure 16:
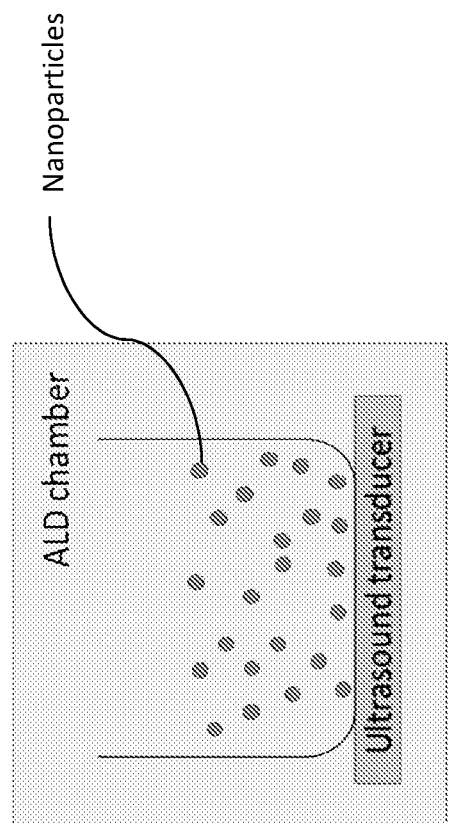
FIG. 16 illustrates jumping particle ALD based on proposed fabrication scheme for 3D multilayer HMM nanospheres.

FIG. 16 illustrates jumping particle ALD based on proposed fabrication scheme for 3D multilayer HMM nanospheres.

To explore the possibility of synthesizing HMM nanospheres two strategies may be pursued including (1) substrate-supported nanoparticle ALD, and (2) jumping particle ALD. In the first approach large area, close-packed monolayers of nanoparticles (e.g., 100-300 nm $SiO_2$) will be fabricated on 4 inch wafers using either LB or evaporative assembly. In the latter, the strong capillary forces at a meniscus can help drive the nanoparticles into a close-packed geometry. The size of the silica nanoparticles will be reduced via RIE to allow additional access of the chemical vapors around the nanoparticles. If further exposure to the surface is needed, anisotropic etching with solutions such as KOH and isotropic dry etching will be used to slightly raise the nanoparticles above the bulk silicon substrate. These techniques are commonly used in the under-etching of devices such as on-chip optical resonators. After depositing metal/dielectric layers via ALD the nanoparticles will be removed from the substrates by mildly sonicating in a solvent or by depositing a polymer such as polyvinylbutyral (PVB), followed by subsequent peel-off and dissolution with a solvent (e.g. ethanol). Polymers such as PVB have been shown to easily adhere to, remove, and disperse nanoparticles attached to a substrate. If challenges arise with detaching the nanoparticles from the substrate, sacrificial layers (e.g., photoresists, metals, etc.) deposited on the wafers prior to nanoparticle assembly will be explored. As illustrated in FIG. 16, the second synthetic strategy involves the elevation of nanoparticles within the ALD chamber via ultrasonic perturbation. Similar nanoparticles as those used in the substrate-supported deposition will be placed in the ALD chamber which is coupled to an ultrasonic transducer or vibrational stage. Under the right frequency and power the nanoparticles will start to jump in the chamber giving full access of the surface during the ALD cycles.

Once the HMM nanospheres are synthesized they will be dispersed in a solvent (e.g., alcohol), and their optical properties will be characterized by depositing them on optically transparent substrates such as glasses or polymers via self-assembly (as described above) or spay-on techniques. In particular, the angle-dependent optical absorption in the NIR and transparency in the visible will be evaluated by using the AZO/ZnO metal/dielectric multilayers. Parameters such as nanoparticle size, inter-particle distance, and extent of ordering will be correlated to the absorption properties.

Since ALD is not limited to just oxide materials, this opens up access to other HMM systems that show different wavelength responses compared to the AZO/ZnO structures. For example, TiN/(Al,Sc)N materials have been shown to produce high-quality epitaxial HMMs with refractory qualities in the visible. Arrays with these types of materials could be advantageous for a variety of applications including TPVs and visible emitters that require cycling at elevated temperatures (>1000° C.). Currently there aren't any tunable and selective visible broadband absorbers that can satisfy these constraints. There is ongoing research on non-selective absorbers and other plasmonic metamaterials, but these are planar systems that either loose efficiency due to parasitic radiation at high temperature or can crack/delaminate due thermal expansion mismatches between the active layer and substrate. The dispensable HMM nanospheres would reduce substrate contact and allow for a wider selection of substrates to be used. To demonstrate the optical capabilities of a hyper-crystal based on the TiN/(Al,Sc)N HMM material system, simulations were carried out on both nanotubes as well as nanospheres (FIG. 12). The data shows broadband absorption >93% (for the nanotubes) and >89% (for the nanospheres) across the visible spectrum while significantly suppressing absorption in the NIR. For the nanosphere geometry, these absorption values occur for a monolayer thickness of only 540 nm thick monolayer. Furthermore, the nanosphere geometry could show even less angle-dependence compared to the transferrable nanotube structures given its high symmetry. The TiN-based visible absorbers will be fully characterized (via experiments and simulations) using similar strategies to those outlined for the AZO/ZnO systems.

In some embodiments, a device having metamaterial nanostructures may include a substrate; and metamaterial nanostructures engaged to the substrate to form an optical layer to interact with light incident to the optical layer to exhibit optical absorption or transmission that is substantially uniform over a spectral range of different optical wavelengths associated with materials and structural features of the metamaterial nanostructures, each metamaterial nanostructure including different material layers that are interleaved to form a multi-layer nanostructure. The different material layers that are interleaved in a metamaterial nanostructure are concentric layers around an axis to form a cylinder and wherein the axis of the cylinder is perpendicular to a local contact area with the substrate. The substrate is a flexible substrate to permit bending of the optical layer. The different material layers include semiconductor and dielectric materials and the substrate is a polymer material. The different material layers that are interleaved in a metamaterial nanostructure are concentric layers around a center to form a sphere. The different material layers that are interleaved in a metamaterial nanostructure. The different material layers include semiconductor and dielectric layers.

In some embodiments, a device having metamaterial nanostructures, comprising a substrate that is flexible; and an array of metamaterial nanopillars engaged to the substrate to form an optical layer, each metamaterial nanopillar including alternating semiconductor and dielectric layers to exhibit a plasmonic response to incident light to exhibit optical absorption or transmission that is substantially uniform over a spectral range of different optical wavelengths associated with materials and structural features of the metamaterial nanopillars. In some designs, each nanopillar can be a solid cylinder. In other designs, each nanopillar can be a hollow cylinder with a center void as a tube. The different material layers include semiconductor and dielectric materials and the substrate is a polymer material.

In some embodiments, a method for making a device having metamaterial nanostructures, comprising forming metamaterial nanostructures on a first substrate by depositing and patterning the deposited materials on the first substrate to form distinctive structures on the first substrate as the metamaterial nanostructures, wherein materials and structural features of the metamaterial nanostructures are designed to exhibit optical absorption or transmission that is substantially uniform over a spectral range of different optical wavelengths, separating the metamaterial nanostructures from the first substrate, and transferring the metamaterial nanostructures onto a second substrate that is different from the first substrate. The first substrate is a semiconductor substrate and the second substrate is a flexible polymer substrate. Each metamaterial nanostructure includes different material layers that are interleaved to form a multi-layer nanostructure, and wherein the method further includes performing an atomic layer deposition (ALD) process to sequentially form the different material layers that are interleaved. The method may also include selecting materials in each metamaterial nanostructure to render the spectral range of different optical wavelengths to be in an infrared range. The method may also include selecting materials and one or more structural features in each metamaterial nanostructure to set the spectral range of different optical wavelengths. The method may also include selecting, in addition to the selection of the materials and the one or more structural features in each metamaterial nanostructure, the relative spacing between different metamaterial nanostructures on the second substrate to set the spectral range of different optical wavelengths. The different material layers that are interleaved and are concentric layers around an axis to form a cylinder and wherein the axis of the cylinder is perpendicular to a local contact area with the first substrate. The different material layers that are interleaved and are concentric layers around a center to form a sphere.

In some embodiments, a structure with multilayered metamaterials includes alternating layers of semiconductor materials, and a secondary substrate to which the alternating layers of dielectric and plasmonic materials formed on a primary substrate is transferred. The plasmonic material has a carrier concentration that exhibits plasmons in a target operating frequency band. The alternating layers of dielectric and plasmonic materials may have a sphere shape in which a number of concentric dielectric and plasmonic layers alternate with each other. Alternatively, the alternating layers of dielectric and plasmonic materials may have a cylinder shape in which a number of coaxial dielectric and plasmonic layers alternate with each other. Here, the plasmonic material may include Transparent Conduction Oxide (TCO), Doped Oxide layers, Aluminum Zinc Oxide (AZO), Indium Tin Oxide (ITO), or Titanium Nitride (TiN), or at least one of the above materials. The dielectric material may include Zinc Oxide (ZnO), Aluminium Nitride (AlN), or Scandium Nitride (ScN), or at least one of the above materials. The secondary substrate may include a polydimethylsiloxane (PDMS) substrate.

In some embodiments, a metamaterial structure may include at least one of unit cylindrical structure. The unit cylindrical structure may include a core formed along an axial portion of the unit cylindrical structure, one or more first layers including a semiconductor material, and one or more second layers including a semiconductor material doped with a metal impurity. The first and second layers have concentric cylinder shapes and alternate along a radial direction of the cylindrical structure. The second layer has more free electrons than the first layer and has less free electrons than those the metal itself has. The unit cylindrical structures form an array in which two or more unit cylindrical structures are periodically arranged on a substrate. The two or more unit cylindrical structures are periodically arranged such that cores of four neighboring unit cylindrical structures form a diamond shape.

In some embodiments, a metamaterial structure may include at least one of unit spherical structures. The unit spherical structure may include a core formed at a center of the spherical cylindrical structure, one or more first layers including a semiconductor material, and one or more second layers including a semiconductor material doped with a metal impurity. The first and second layers have concentric sphere shapes and alternate along a radial direction of the spherical structure. Here, the second layer has more free electrons than the first layer and has less free electrons than those the metal itself has. The unit cylindrical structures form an array in which two or more unit cylindrical structures are periodically arranged on a substrate. The first layer can include Zinc Oxide (ZnO), Aluminium Nitride (AlN), or Scandium Nitride (ScN). The second layer can include Transparent Conduction Oxide (TCO), Doped Oxide layers, Aluminum Zinc Oxide (AZO), Indium Tin Oxide (ITO), or Titanium Nitride (TiN).

The THMMP implemented based on the disclosed technology shows tunable, selective, and broadband near-perfect, omnidirectional absorption. The broad absorption bandwidth is a result of the coalescence of absorption peaks due to bulk or surface plasmon-polaritons in the AZO and lossy modes that exist due to the hyperbolic dispersion of the arrays. With the ability to remove these particles from their growth substrates, the arrays may be transferred to visibly transparent and mechanically flexible substrates while maintaining their broadband absorption in the NIR. The synthetic strategies presented here are universal and can be applied to other nanoparticle systems. Not only would this enable a host of different materials that operate at distinct parts of the electromagnetic spectrum, but it is anticipated that novel light-matter interactions that have yet to be explored would be uncovered.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Additional enhancements and variations can be made based on what is described and illustrated in this patent document.

What is claimed is:

1. A device having metamaterial nanostructures, comprising:
    a substrate; and
    metamaterial nanostructures engaged to the substrate to form an optical layer to interact with light incident to the optical layer to exhibit optical reflection or absorption or transmission that is substantially uniform over a spectral range of different optical wavelengths associated with materials and structural features of the metamaterial nanostructures, each metamaterial nanostructure including different material layers that are interleaved to form a multi-layer nanostructure,
    wherein the different material layers in at least one of the metamaterial nanostructures are concentric layers around a center to form a sphere.

2. The device as in claim 1, wherein the different material layers in at least one of the metamaterial nanostructures are concentric layers around an axis to form a cylinder and wherein the axis of the cylinder is perpendicular to a local contact area with the substrate.

3. The device as in claim 2, wherein the substrate is a flexible substrate to permit bending of the optical layer.

4. The device as in claim 2, wherein the different material layers include semiconductor and dielectric materials and the substrate is a polymer material.

5. The device as in claim 4, wherein the semiconductor material includes Transparent Conduction Oxide (TCO), Doped Oxide, Aluminum Zinc Oxide (AZO), Indium Tin Oxide (ITO), or Titanium Nitride (TiN).

6. The device as in claim 4, wherein the dielectric material includes Oxide (ZnO), Aluminum Nitride (AlN), or Scandium Nitride (ScN).

7. The device as in claim 2, wherein the different material layers include semiconductor and dielectric layers.

8. A device having metamaterial nanostructures, comprising:
    a substrate that is flexible; and
    an array of metamaterial nanopillars attached to the substrate to form an optical layer, each metamaterial nanopillar including alternating semiconductor and dielectric layers to exhibit a plasmonic response to incident light to exhibit optical reflection or absorption or transmission that is substantially uniform over a spectral range of different optical wavelengths associated with materials and structural features of the metamaterial nanopillars,
    wherein each nanopillar is a hollow cylinder with a center void as a tube.

9. The device as in claim 8, wherein the array of metamaterial nanopillars further includes a nanopillar that is a solid cylinder.

10. The device as in claim 8, wherein the substrate is a polymer material.

11. The device as in claim 8, wherein the semiconductor layer includes Transparent Conduction Oxide (TCO), Doped Oxide, Aluminum Zinc Oxide (AZO), Indium Tin Oxide (ITO), or Titanium Nitride (TiN).

12. The device as in claim 8, wherein the dielectric layer includes Zinc Oxide (ZnO), Aluminum Nitride (AlN), or Scandium Nitride (ScN).

13. The device as in claim 1, wherein the substrate is a flexible substrate to permit bending of the optical layer.

14. The device as in claim 1, wherein the different material layers include semiconductor and dielectric materials and the substrate is a polymer material.

15. The device as in claim 14, wherein the semiconductor material includes Transparent Conduction Oxide (TCO), Doped Oxide, Aluminum Zinc Oxide (AZO), Indium Tin Oxide (ITO), or Titanium Nitride (TiN).

16. The device as in claim 15, wherein the dielectric material includes Oxide (ZnO), Aluminum Nitride (AlN), or Scandium Nitride (ScN).

* * * * *